United States Patent [19]

Ferrer et al.

[11] Patent Number: 5,422,575
[45] Date of Patent: Jun. 6, 1995

[54] TEST FIXTURE WITH ADJUSTABLE BEARINGS AND OPTICAL ALIGNMENT SYSTEM

[75] Inventors: Mary E. Ferrer, Hannacroix; Gary F. St. Onge, Ballston Lake, both of N.Y.; Charles J. Johnston, Walnut; Mark A. Swart, Upland, both of Calif.

[73] Assignee: Everett Charles Technologies, Inc., Pomona, Calif.

[21] Appl. No.: 224,006

[22] Filed: Apr. 5, 1994

Related U.S. Application Data

[60] Division of Ser. No. 84,755, Jun. 30, 1993, Pat. No. 5,300,881, which is a continuation of Ser. No. 896,479, Jun. 9, 1992, abandoned.

[51] Int. Cl.⁶ ............................................. G01R 31/02
[52] U.S. Cl. ................................. 324/754; 324/755
[58] Field of Search ............ 324/158 R, 158 F, 73.1, 324/537, 754, 761, 750, 72.5, 158.1; 348/135; 439/480, 482; 356/400, 401

[56] References Cited

U.S. PATENT DOCUMENTS

| | | | |
|---|---|---|---|
| 3,936,743 | 2/1976 | Roch | 324/158 F |
| 4,066,943 | 1/1978 | Roch | 324/158 F |
| 4,758,780 | 7/1988 | Coon et al. | 324/158 F |
| 4,812,754 | 3/1989 | Tracey et al. | 324/158 F |
| 4,820,975 | 4/1989 | Diggle | 324/158 F |
| 4,929,893 | 5/1990 | Sato et al. | 324/158 F |
| 5,150,041 | 9/1992 | Eastin et al. | 324/158 F |
| 5,291,127 | 3/1994 | Park et al. | 324/158 P |

FOREIGN PATENT DOCUMENTS

| | | |
|---|---|---|
| 1530350 | 10/1976 | United Kingdom . |
| WO90/06518 | 11/1989 | WIPO . |

OTHER PUBLICATIONS

Test Point 1 Catalog entitled "Zero Defects is 'Accuprobe' Aim", pp. 11–20, undated.

*Primary Examiner*—Vinh Nguyen
*Attorney, Agent, or Firm*—Christie, Parker & Hale

[57] ABSTRACT

A test fixture for testing circuit boards has a vacuum chamber between a stationary probe plate and a movable top plate. Separate adjustable linear bearings located in quadrants of the fixture provide parallel alignment between the top plate and the probe plate. A continuous vacuum seal between the probe plate and top plate bypasses the bearings so the bearings are outside the vacuum area. Spring loaded test probes in the probe plate extend through holes in the top plate for access to a circuit board under test. The probes contact the board when the top plate moves down toward the probes under a vacuum. The top plate is secured to the probe plate by separate quick-release latch pins extending through the linear bearings. The moving top plate carries fixed tooling pins for mounting the board to the top plate. Movable bearing blocks support the bearings. The top plate is movable for aligning the board with the test probes. The top plate, latch pins, bearings and bearing blocks are movable as a unit relative to the probe plate. After the top plate is aligned with the probes to compensate for art shift among circuit board lots, the quick-release latches are engaged to retain the alignment. The latches are part of a guide post assembly for guiding vertical travel of the top plate during vacuum cycling of the test fixture. An optical alignment system in combination with the movable bearings provides a quick and easy means of aligning the board and the probes with extremely high accuracy.

1 Claim, 20 Drawing Sheets

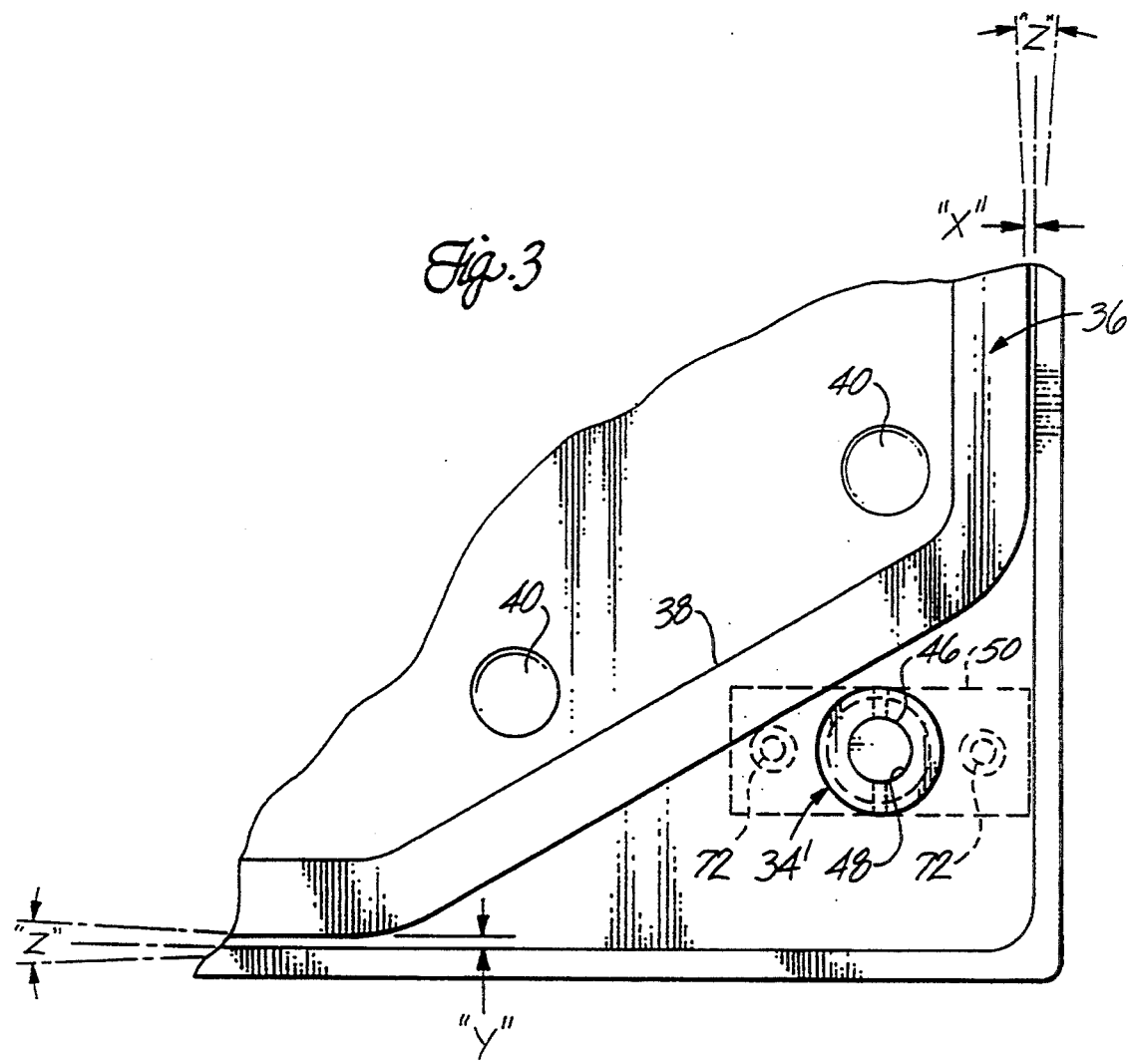

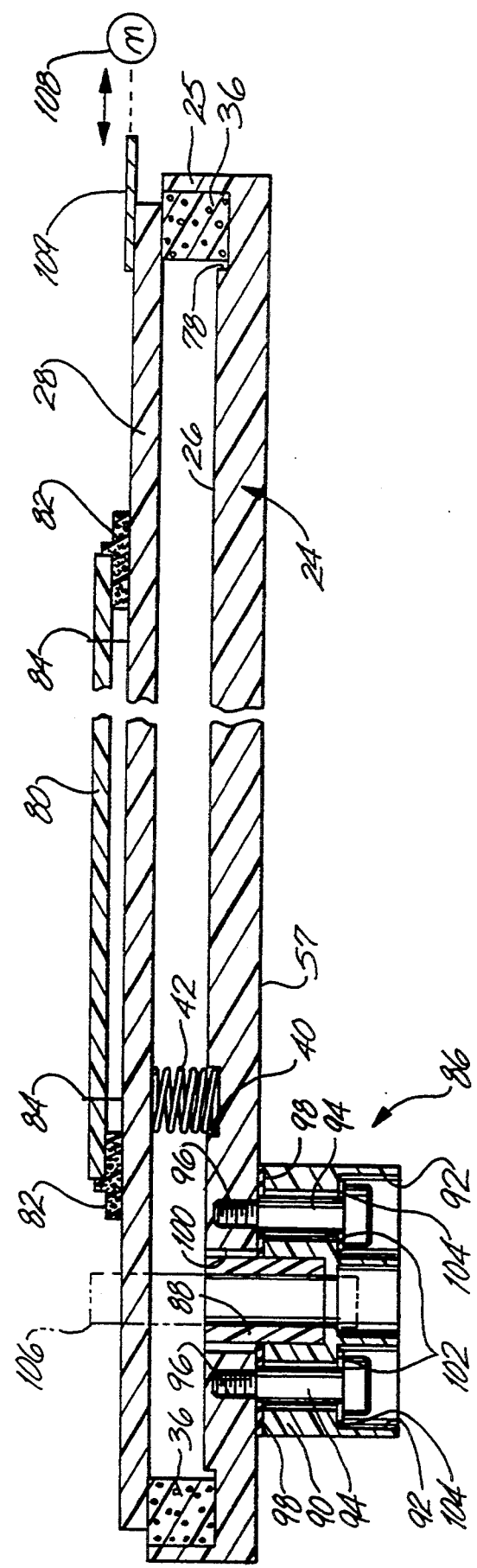

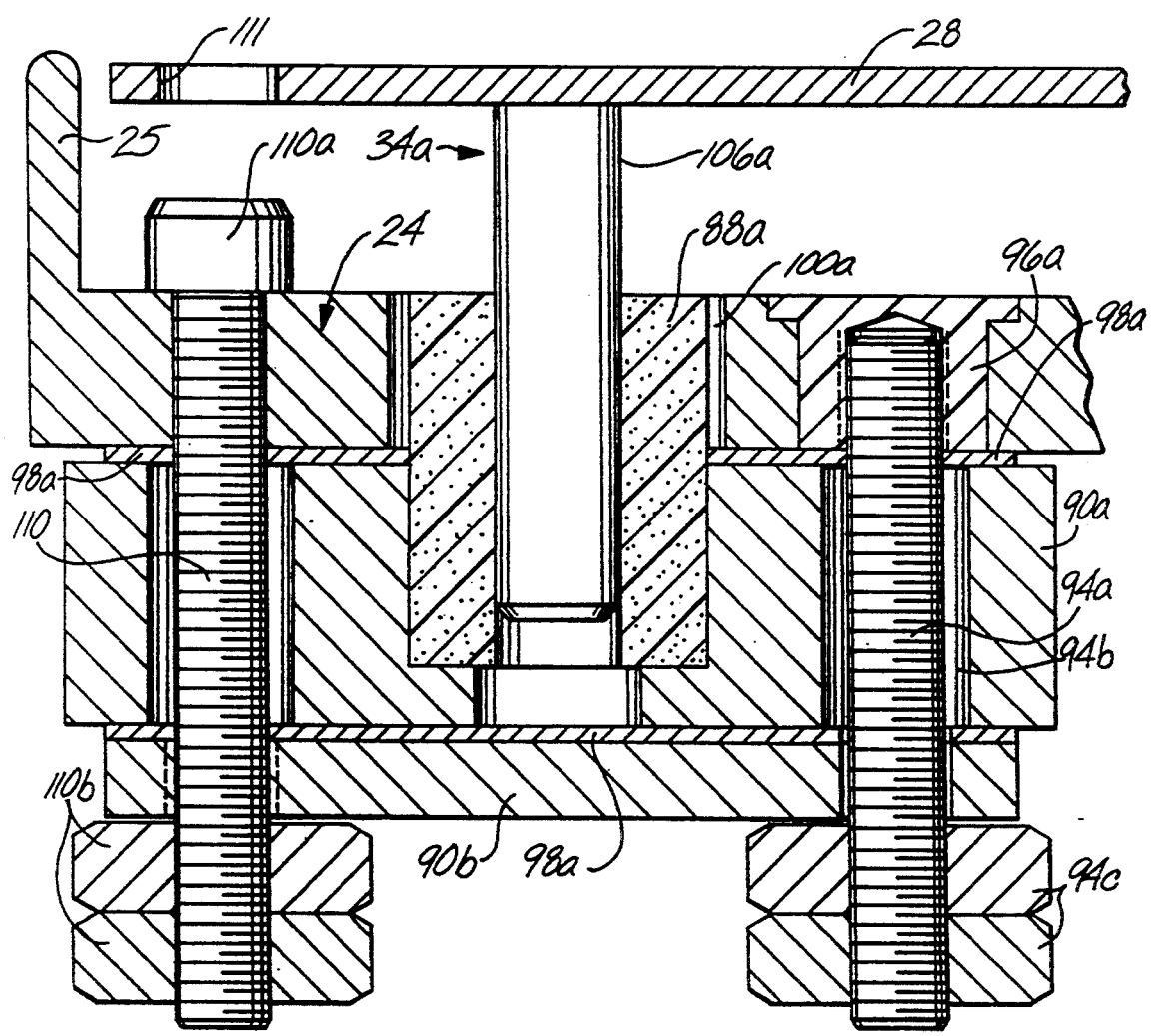

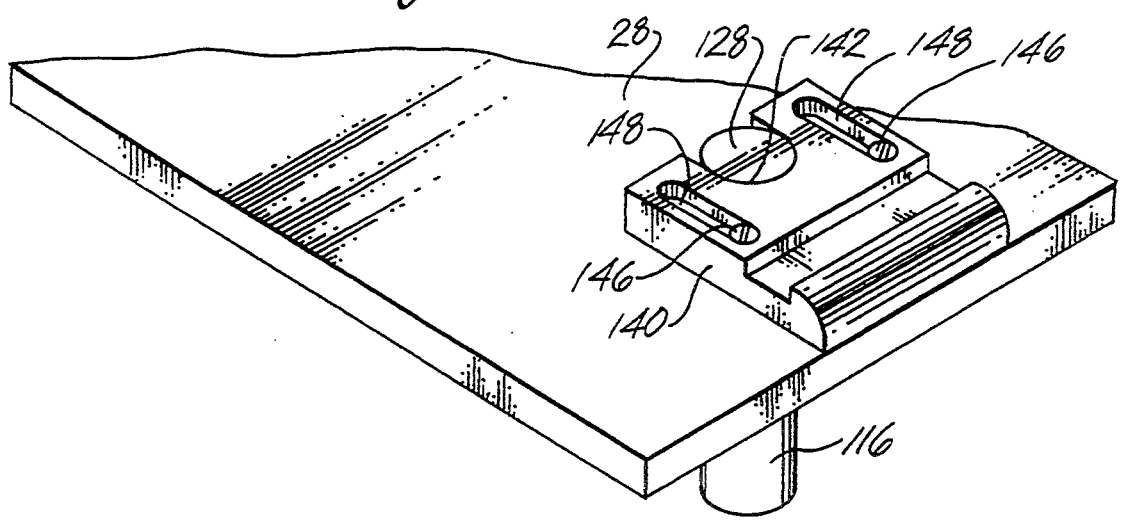
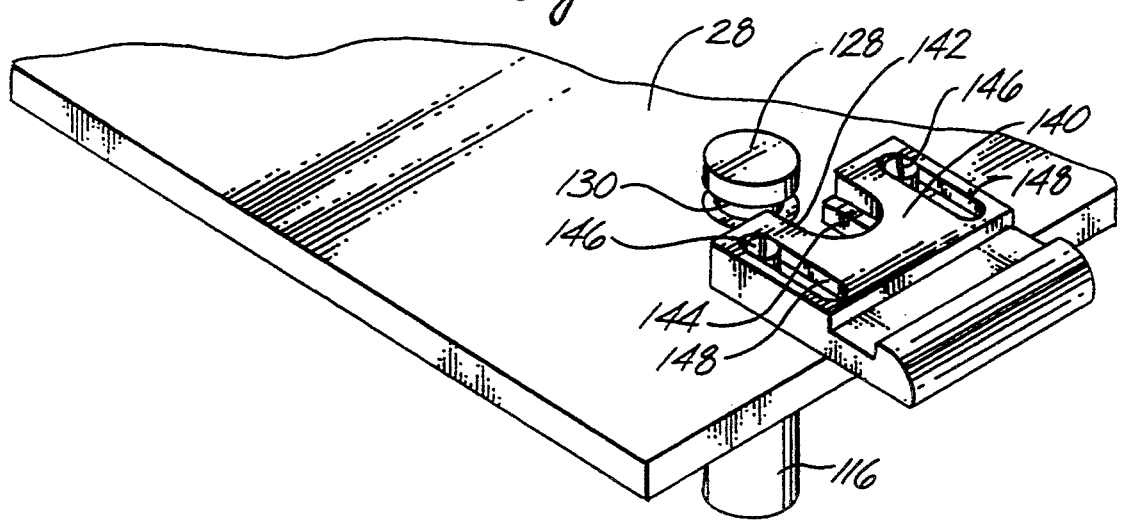

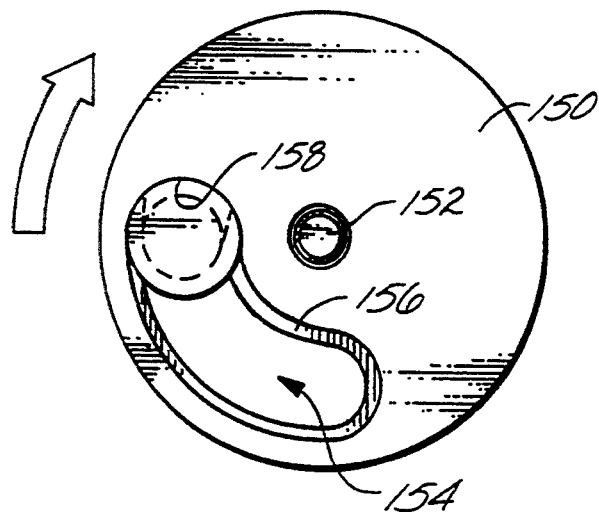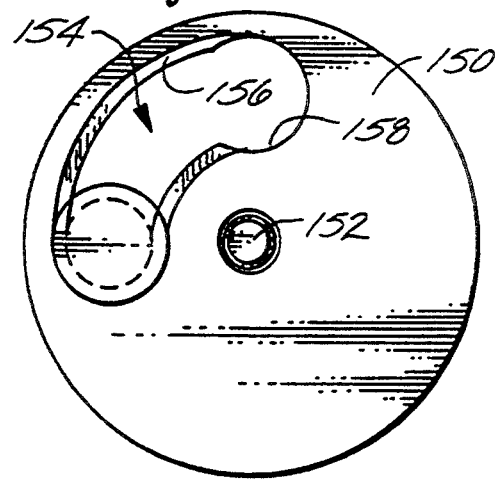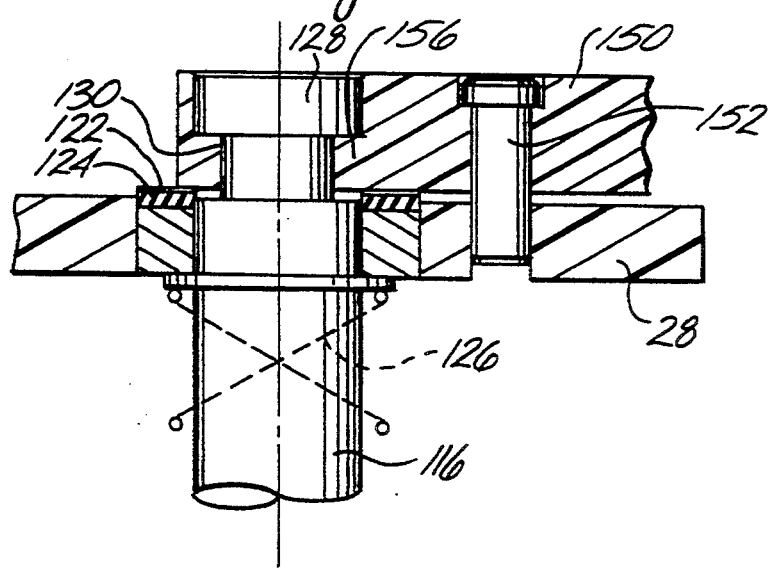

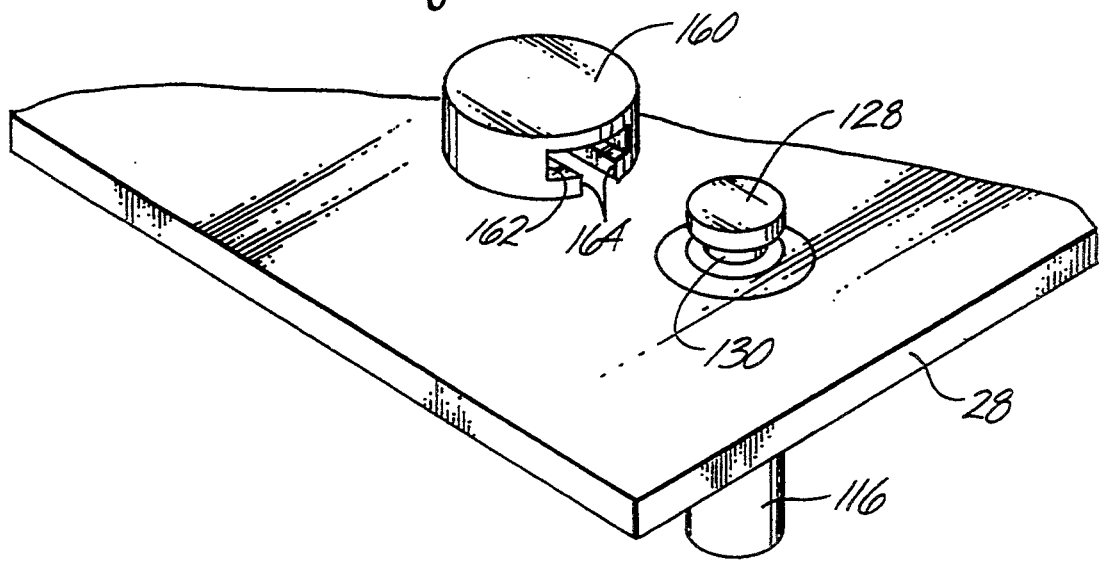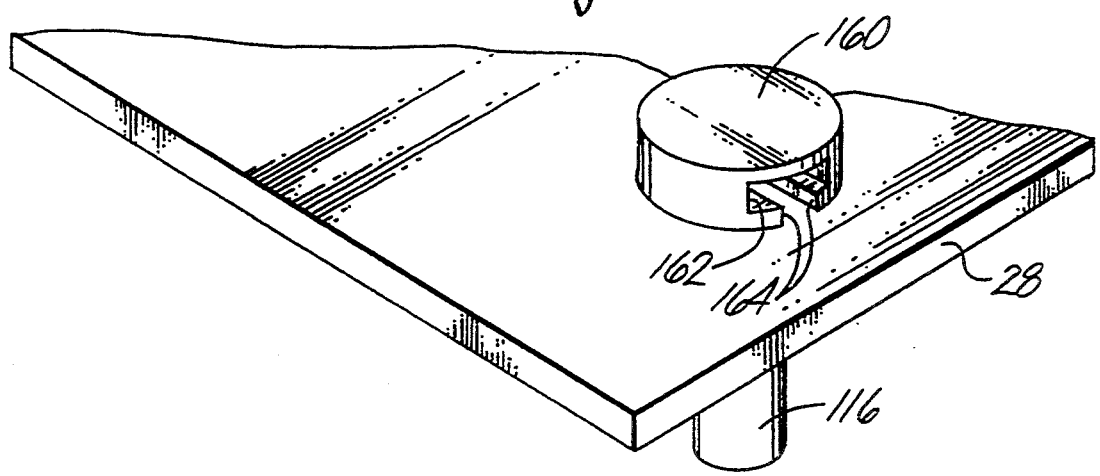

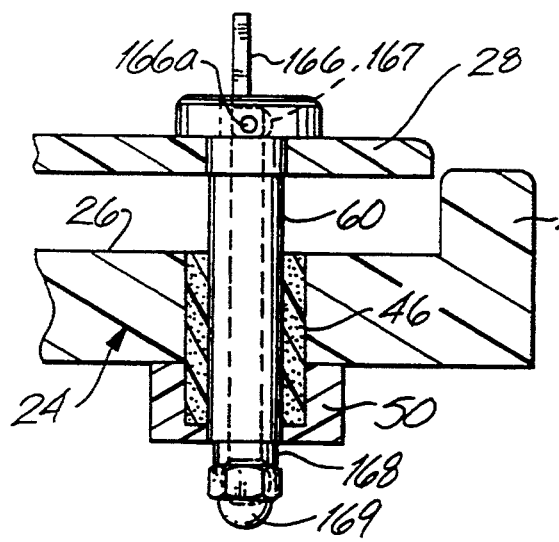
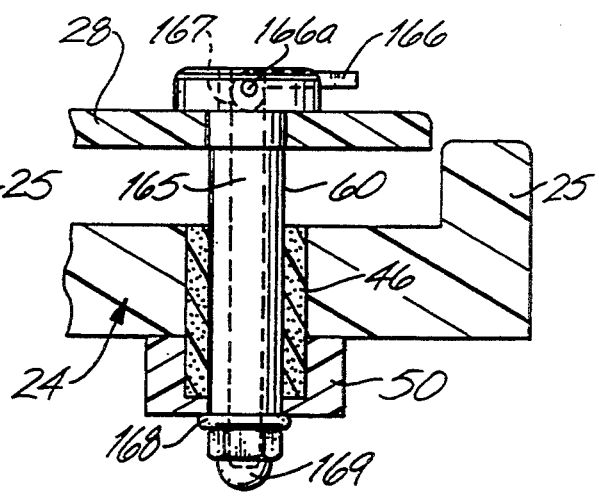
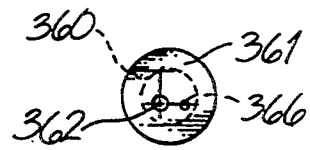
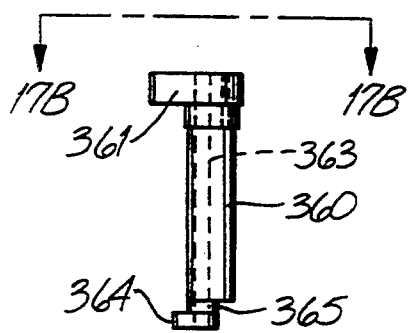
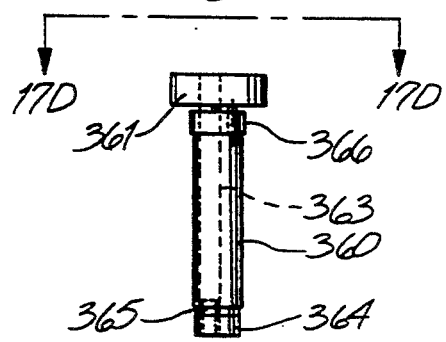

TEST FIXTURE WITH ADJUSTABLE BEARINGS AND OPTICAL ALIGNMENT SYSTEM

This is a division of application Ser. No. 08/084,755 filed Jun. 30, 1993, now U.S. Pat. No. 5,300,881, which is a continuation of Ser. No. 07/896,479 filed Jun. 9, 1992, now abandoned.

FIELD OF THE INVENTION

This invention relates generally to in-circuit testing apparatus for printed circuit boards, and more particularly, to an in-circuit test fixture having an improved alignment and vacuum seal system for making reliable contact with circuit boards under test.

BACKGROUND OF THE INVENTION

Automatic test equipment for checking printed circuit boards has long involved use of a "bed of nails" test fixture to which the circuit board is mounted during testing. This test fixture includes a large number of nail-like, spring loaded test probes arranged to make electrical contact under spring pressure with designated test points on the board under test. Any particular circuit laid out on a printed circuit board is likely to be different from other circuits, and consequently, the bed of nails arrangement for contacting test points in a particular board must be customized for that circuit board. When the circuit to be tested is designed, a pattern of test points to be used in checking it is selected, and a corresponding array of test probes is configured in the test fixture. This typically involves precision-drilling a pattern of holes in a probe plate to match the customized array of test probes, and then mounting the test probes in the drilled holes on the probe plate. The circuit board is then mounted to the fixture, superimposed over the array of test probes. During testing, the spring loaded test probes are brought into spring pressure contact with the test points on the board under test. Electrical test signals are transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board into pressure contact for in-circuit testing. One class of these fixtures is a wired test fixture in which the test probes are individually wired to separate interface contacts for use in transmitting test signals from the probes to the external test analyzer. These wired test fixtures are often referred to as "vacuum test fixtures" since a vacuum is applied to the interior of the test fixture housing during testing to draw the circuit into contact with the test probes. A movable top plate is mounted over the stationary probe plate and a vacuum seal is formed between the top plate and the probe plate. A second vacuum seal is mounted above the top plate and has a sufficient height to hold the printed circuit board above the spring probes which project through access holes drilled in the top plate for alignment with the underside of the board. During use, a vacuum applied to the region between the probe plate and the top plate is also applied to the underside of the board. This compresses both vacuum seals and pulls the board down against and into electrical contact with the test probes. By maintaining the vacuum seal, the probes are held in spring pressure contact with the test points on the board while the board is tested.

In order for the probes to make contact with the proper test points of the circuit board, the bottom stationary probe plate and the movable top plate which supports the board must remain in a parallel relationship, to hold the board flat while maintaining its position perpendicular to the probe field. A reliable vacuum seal also is necessary.

Various problems have existed in prior art in-circuit test fixtures. U.S. Pat. No. 4,538,104 to Douglas et al. discloses an in-circuit test fixture of the type described above. That patent refers in its background to various technical problems in manufacturing and using such in-circuit test fixtures. One problem has to do with reliably maintaining the alignment parallel to each other and between the top plate and the stationary probe plate, while the test probes are maintained in parallel alignment, perpendicular to the board. The top plate moves toward or away from the stationary probe plate on linear bearings and/or guide pins which allow for alignment of the top plate to the probe field as the board moves up or down. The test probes are disposed in matching patterns of holes drilled in the probe plate and in the top plate. The probes must remain in parallel alignment and the top plate must constantly move in parallel alignment with the probe plate on the bearings without causing any binding between these elements of the test fixture.

The vacuum seal system must prevent vacuum leakage and poor electrical contact between the spring probes and the circuit board under test.

In addition to the need for precisely aligning the top plate and the board with the test probes without mechanical problems, and the need for an efficient vacuum sealing system, the test fixture also should be adapted for easy use under repetitive test conditions by the end-user. The fixture also should be designed so that its component parts can be manufactured and assembled at a reasonable cost.

The present invention provides improvements over the type of in-circuit test fixture shown in the Douglas et al. '104 patent. For instance, the fixture in that patent has thumb screws inside four corners of the fixture that screw into long, narrow, rigid guide shafts affixed to the undersurface of the moving top plate. These long guide shafts fit through the center of linear bearings at the four corners of the probe plate. It can be difficult to remove the top plate because the thumb screws must be accessed from going inside the bottom portion of the fixture to unscrew the thumb screws before the top plate can be lifted out. In addition, the four guide shafts at the corners of the top plate can bind when the user manually removes the top plate. There is a need for an improved system of connecting the moving top plate to the probe plate since it is not desirable for the user to open up the fixture from access in the lower portion of the fixture where much of the complicated wiring is present. However, when the top plate needs to be removed, for service or diagnostic requirements, such as when a test probe must be replaced, it is desirable for the top plate to be removed as easily as possible.

The sealed linear bearing assemblies located at the corners of the Douglas et al. '104 fixture are complex and costly in terms of the number of parts and the labor for assembling the bearings. The present invention provides a greatly improved bearing system.

The Douglas et al. '104 patent also discloses an internal captive seal which surrounds the perimeter of the moving top plate. The top plate seal is a continuous double hollow seal. The underside of the top plate has a peripheral flange which fits down into a deep recess that carries the perimeter seal. The present invention provides a more stable vacuum seal that is manufactured at substantially lower cost. The seal arrangement also allows for "floating" of the top plate, which enables multi-axis freedom of movement of the top plate that is more useful in the proper alignment of the test probe array to test points on a board under test. The seal arrangement of this invention also avoids costly sealed bearings, and therefore substantially reduces manufacturing and labor costs.

There is also a need to provide a linear bearing arrangement that can reliably secure the top plate to the probe plate, without shifting of the top plate relative to the probe field, while also allowing the top plate to be released, when necessary, for shifting in different directions for alignment purposes. Such a bearing support system should be easily usable by the end-user while also being manufactured at a reasonable cost.

SUMMARY OF THE INVENTION

Briefly, one embodiment of this invention provides an in-circuit test fixture for testing printed circuit boards. The fixture has a vacuum chamber between a stationary probe plate and a movable top plate. Separate adjustable linear bearings located at each quadrant of the fixture provide parallel alignment between the moving top plate and the probe plate. A continuous enclosed vacuum seal located between the probe plate and the top plate bypasses the bearings so the bearings are outside the vacuum area. Spring loaded test probes in the probe plate extend through holes in the top plate for access to the circuit board supported on a second vacuum seal above the top plate. The probes make spring biased electrical contact with the board when the top plate is moved down toward the probes under a vacuum applied to the bottom of the top plate. The top plate is secured to the probe plate by separate quick release latches extending through the linear bearings. Releasing the latch connections to the bearings allows the top plate to move in a plane aligned with the plane of the top plate for use in precisely aligning the board under test with the probe field. In one embodiment, the bearings that support the top plate are movable with the top plate during the alignment process. Subsequent connection of the releasable latch connectors in each bearing secures the top plate in parallel alignment with the probe plate, with the probe field accurately aligned perpendicular to the board.

The adjustable linear bearings provide smooth precise perpendicular travel of the board to the probe field, ensuring accurate probe contact to all test points simultaneously. The bearing system also allows use of top plate tooling pins for holding the board in place while the top plate moves for precise alignment of the board with the probe field. This compensates for printed circuit board screened art "shift" often experienced between manufacturing lots. It also compensates for tolerance stack-up caused by inherent product limitations of circuit board and test fixture fabrication equipment. In one embodiment, the movable tooling pins carried on the floating top plate permits precise registration adjustments up to about plus/minus 0.060 inch in any direction of travel of the circuit board relative to the probe field.

The linear bearings are constructed from an assembly of components that reduces manufacturing time and cost of the bearings, including avoiding the need for sealed bearings, inasmuch as the top plate is supported by bearings that, can be located outside the vacuum area. The quick release latch system secures the top plate to the fixture and is easily unlatched to provide for quick removal of the top plate for service/diagnostic requirements. The quick release latch secures the top plate to the probe plate, preventing top plate shift and probe tip-to-test target registration problems.

One embodiment of the invention provides an optical alignment system that functions with the adjustable bearing system to provide quick and accurate alignment of the board under test with the test probes. This embodiment is useful for alignment of a test fixture having a movable top plate carrying tooling pins that support the board under test in a fixed position on the moving top plate. The moving top plate is supported on the fixture base by a system of bearings that normally guide vertical up and down travel of the top plate toward the test probes which are mounted in a fixed probe plate below the top plate. Each bearing, in one embodiment, includes a fixed guide post carried on the top plate and positioned for vertical sliding movement inside a corresponding linear bearing sleeve. The bearing sleeves are carried on corresponding bearing blocks adjustable to a first position allowing the post to be freely movable with the top plate relative to the bearing sleeve and its bearing block. Each bearing block is also adjustable to a second position in which its corresponding bearing sleeve is retained in a fixed position relative to the fixture base for guiding the vertical sliding travel of each post in its corresponding fixed bearing sleeve. In the alignment process, the bearing blocks are adjusted to their first position allowing freedom of movement of the top plate relative to the probe field on the probe plate. An optical alignment system is used for aligning the board under test relative to the probe field when the bearings are in the first position allowing such freedom of movement. The optical alignment system includes means for sensing the position of a fiducial mark on the board and providing an optical reading showing any misalignment of circuits on the board relative to the probe field. The top plate is moved for aligning the board and the fiducial mark on it relative to an optical probe which is connected to a video camera system for displaying an optical image of the fiducial mark relative to a calibrated fixed reference point on a video screen. By moving the top plate and observing the optical image on the screen, the image of the fiducial mark can be moved into alignment with the fixed reference point for indicating correct alignment of the circuits on the board relative to the probe field. The adjusted first position of the bearing systems allow such freedom of movement of the top plate during the optical alignment procedure. Following correct alignment of the board relative to the probe field, the bearing blocks can be adjusted to their fixed second positions to provide the fixed means for guiding vertical travel of the board relative to the probes during testing.

These and other advantages of the invention will be more fully understood by referring to the following detailed description and the accompanying drawings.

BRIEF DESCRIPTION OF THE DRAWINGS

FIG. 3 is a fragmentary, semi-schematic top view showing a linear bearing and a vacuum seal at one corner of the probe plate portion of the fixture.

FIG. 5 is a semi-schematic cross-sectional view showing an alternative linear bearing system and floating top plate.

FIG. 5A is a fragmentary schematic side elevation view showing a method for pinning a bearing block to the fixture base.

FIG. 6 is a fragmentary, semi-schematic cross-sectional view showing a further embodiment of a linear bearing system.

FIGS. 7 and 8 are fragmentary top perspective views illustrating one embodiment of a quick release latch.

FIGS. 9 and 10 are fragmentary top perspective views illustrating another embodiment of a quick release latch.

FIG. 11 is a top view of a further alternative embodiment of a quick release latch.

FIG. 12 is a fragmentary, semi-schematic cross-sectional view of the latch shown in FIG. 11.

FIG. 13 is a top view similar to FIG. 11 showing the latch in its locked position.

FIGS. 14 and 15 are fragmentary top perspective views illustrating further embodiments of a quick release latch.

FIG. 16 is a schematic side elevation view showing a cam-operated locking pin in its unlocked position.

FIG. 17 is a schematic side elevation view showing the cam-operated locking pin of FIG. 16 in its locked position.

FIG. 17A is a side elevational view showing a tab lock pin in its latched position.

FIG. 17B is a top view taken on line 17B—17B of FIG. 17A.

FIG. 17C is a side elevational view of the tab lock pin in its unlatched position.

FIG. 17D is a top view taken on line 17D—17D of FIG. 17C.

DETAILED DESCRIPTION

Figure 1:
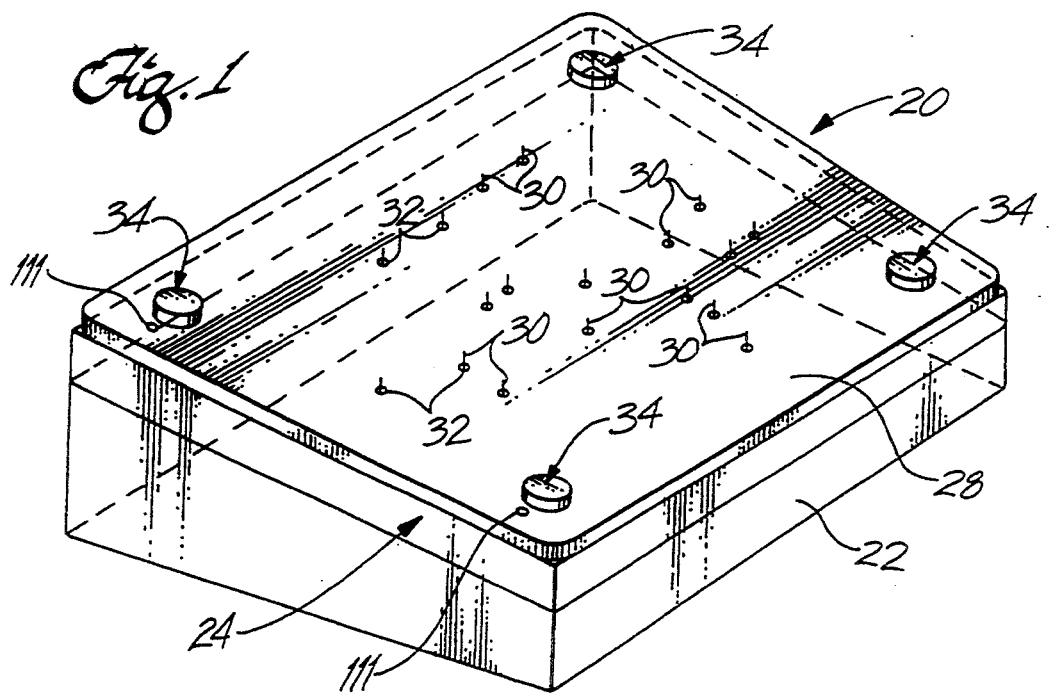
FIG. 1 is a top perspective view illustrating the exterior of an in-circuit vacuum test fixture according to principles of this invention.
Figure 2:
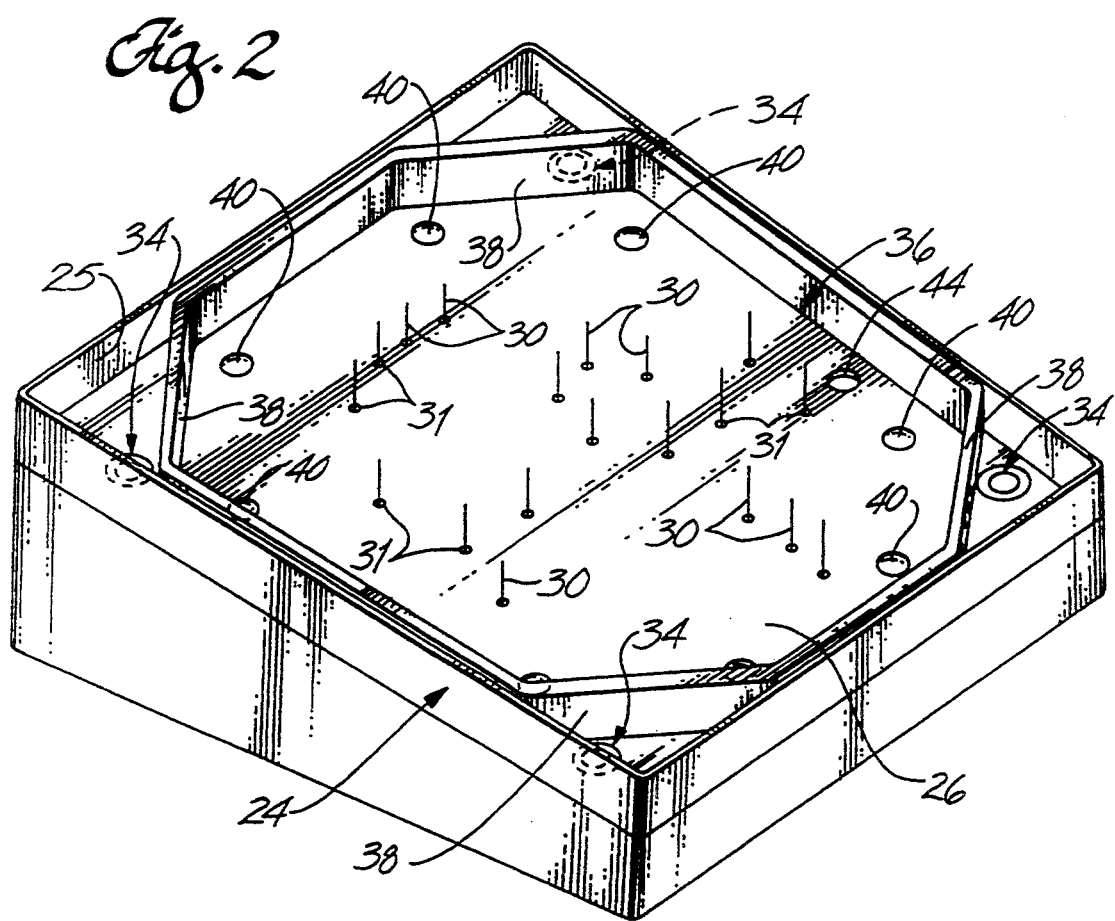
FIG. 2 is a top perspective view showing the fixture of FIG. 1 with the top plate removed.

FIGS. 1 and 2 are perspective views illustrating one embodiment of an in-circuit test fixture 20 which incorporates principles of this invention. The fixture includes a rectangular vacuum housing having a lower base plate 22 and a vacuum well sub-assembly 24 mounted above the base plate. The vacuum well sub-assembly includes a rectangular vacuum well formed by an upright rectangular wall 25 extending around the perimeter of the fixture. The bottom of the vacuum well is formed by a stationary, rectangular, rigid probe plate 26 within the confines of the outer wall 25. The sub-assembly also includes a flat, rectangular, movable top plate 28 resting on a gasket seal inside the wall 25 of the vacuum well. The top plate extends above and parallel to the plane of the probe plate 26. A plurality of spring loaded test probes 30 are mounted in fixed positions in the probe plate 26. The test probes, shown schematically in FIGS. 1 and 2, are conventional spring loaded test probes well known in the art. The test probes are anchored in holes 31 precision-drilled in the probe plate. The test probes extend upwardly from the holes in the probe plate and project through a corresponding pattern of access holes 32 precision-drilled in the top plate 28. The holes 31 and 32 are shown exaggerated in size for simplicity. The hole patterns for the probes are identical, and corresponding holes for each probe are aligned so that the probes as a group extend parallel to one another and perpendicular to the plane of the movable top plate 28.

Several features of the in-circuit test apparatus well known and conventional within the art are not shown. These include a vacuum connection to the interior of the fixture for drawing a vacuum in the vacuum chamber space between the movable top plate 28 and the stationary probe plate 26. The circuit board under test also is not shown in FIGS. 1 and 2. The board rests on a vacuum seal (not shown) affixed to the top of the movable top plate so as to surround the probe field and normally support the board above and spaced from the tips of the test probes. This arrangement of the board and top plate is shown in FIG. 5 and described in more detail below. The bottom of the movable top plate can have stops (not shown) for contacting the probe plate to control the distance between the two plates at maximum travel. In one embodiment, 0.030 inch thick stops are used. The probes are aligned for contact with test points in circuits on the board, and when a vacuum is drawn within the vacuum chamber, the vacuum is also applied to the space below the board and above the top plate. This compresses the board down toward and into electrical contact with the test probes for use in conducting circuit continuity testing. The probes in the probe plate are individually wired to separate interface connections (not shown) within the fixture housing below the probe plate. These interface connections are coupled to an external electronic test analyzer (not shown) for conducting in-circuit testing on the board in the well-known manner.

The vacuum well sub-assembly, including the moving top plate 28 and the stationary probe plate 26, are shown in FIGS. 1 and 2 in an ergonomic design extending at a slope angle to provide improved access which reduces operator fatigue. Although these components of the test fixture extend at an angular position with respect to the normal horizontal plane, the test fixture is arranged so that the test probes 30 extend perpendicular to the planes of the top plate and the probe plate which, in turn, extend parallel to one another. Other illustrations of these components of the invention in the drawings are shown in normal horizontal and vertical orientations for simplicity. Alternately, the top of the test fixture can be parallel to the bottom of the fixture if the test system is on an angle.

Referring to FIG. 2, the top plate 28 is supported for movement toward or away from the probe plate 26 on a system of upright linear bearings 34. The bearings are preferably located in quadrants spaced around the perimeter of the test fixture. In a preferred arrangement, the bearings are located in the four corners of the probe plate 26. The present invention includes several embodiments of linear bearing assemblies described in more detail below. The linear bearings 34 secure the top plate 28 in a fixed position relative to the probe plate 26 so that circuit boards supported on the top plate are precisely aligned with the probe field. Each linear bearing assembly includes a quick-release latch assembly 34 (the top external portion of the assembly is shown in FIG. 1) for use in removing the top plate from the fixture. This allows access to the inside of the vacuum well.

The inside of the vacuum well assembly also includes a continuous one-piece annular compressible vacuum seal 36 extending generally around the perimeter of the probe plate 26. The vacuum seal 36 has angled corners 38 which extend inside the linear bearings 34 seated in the corners of the probe plate 26. This ensures that the bearing assemblies 34 are outside the vacuum area formed within the fixture in the space inside the vacuum seal 36. This avoids the need to provide additional vacuum seals for each linear bearing for sealing the bearings against leakage from vacuum drawn inside the vacuum chamber (within the closed-form seal 36) during testing. The vacuum seal and linear bearing assembly are described in more detail below.

FIG. 2 also illustrates further components of the invention including circular recessed areas 40 in the upper surface of the probe plate 26 for retaining compression springs 42 (see FIG. 5) for resiliently supporting the underside of the moving top plate 28. One or more vacuum ports 44 in the probe plate are located within the vacuum region sealed by the vacuum seal 36. The vacuum port 44 extends through the entire depth of the probe plate to provide a means of communicating vacuum drawn from the underside of the probe plate 26 through the vacuum port 44 to the interior of the space within the seal 36. The vacuum is also drawn through the access holes 32 of the top plate to the underside of a board under test supported above the probes 30 on the moving top plate 28. Thus, a vacuum drawn inside the vacuum well assembly through the vacuum ports 44 moves the top plate 28 downwardly to compress the board into contact with the tips of the test probes 30 which extend through the top plate for access to the underside of the board.

Figure 4A:
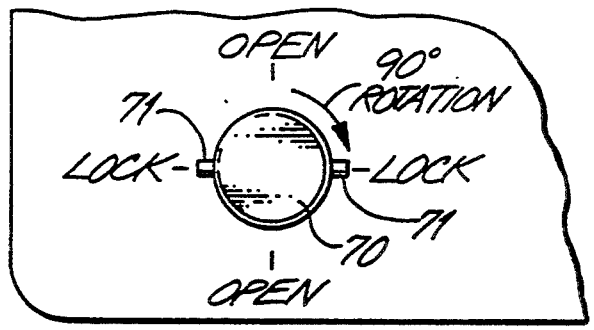
FIG. 4A is a fragmentary top view taken on line 4A—4A of FIG. 4.
Figure 4:
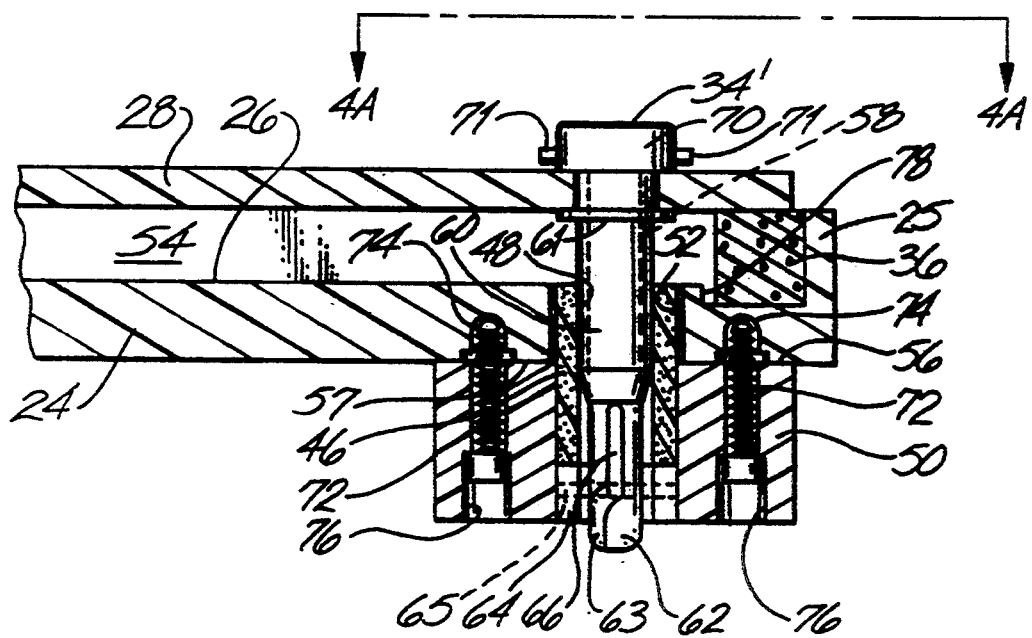
FIG. 4 is a fragmentary cross-sectional view of the linear bearing and vacuum seal shown in FIG. 3.

FIGS. 3 and 4 illustrate one embodiment of the linear bearing assembly 34 in combination with the vacuum seal 36 supporting the underside of the moving top plate 28. In this embodiment, each linear bearing assembly comprises an elongated upright cylindrical open-ended tubular bearing sleeve 46 which is made of a hard plastic. The material from which the bearing sleeve is made naturally forms a lubricated circular opening 48 of uniform diameter through the bearing sleeve. The linear bearing sleeve 46 is carried by a bearing block 50 which adjustably mounts to the underside of the probe plate 26 below a circular open-ended passage 52 extending through the probe plate from the vacuum chamber 54 to the underside of the probe plate. The bearing block 50 has a flat upper face 56 which lies flat against a flat bottom surface 57 of the probe plate. The bottom portion of the linear bearing sleeve is rigidly affixed in the bearing block 50. The bearing sleeve 46 projects upwardly from the upper face 56 of the bearing block and into the passage 52 through the probe plate. The diameter of the passage 52 is oversized with respect to the outside diameter of the bearing sleeve 46 so that the bearing sleeve can have complete freedom of movement for a full 360 degrees of shifting within the confines of the surrounding passage 52.

A quick-release latch 34' in each corner of the moving top plate includes a rigid quarter-turn post 58 which extends down through a stationary sleeve 60 rigidly affixed to the top plate. The sleeve 60 extends from the top face of the top plate through the interior of the linear bearing sleeve 46. The sleeve 60 is rigidly held in the top plate by a knurl through the top plate and a retaining clip 61. The sleeve 60 makes a close vertically sliding fit inside the linear bearing sleeve 46. The lubricated inside diameter of the bearing sleeve assists vertical sliding travel of the sleeve 60 in the hard plastic linear bearing 46. The quarter-turn post 58 has a lower portion 62 with a spiral cam 63 machined in it. An annular lower portion 64 of the bearing block 50 extends under the linear bearing 46. This portion 64 of the bearing block carries a transverse lock pin 65 which engages and rides in the spiral cam 63 on the post 58. An elongated slot 66 extends along the post above the cam 63. The post has a quick-release head 70 which can rotate a quarter-turn to tighten the bottom of the post into the receptacle portion of the bearing block, or to loosen the post from engagement with the receptacle in the bearing block. When the post is turned a quarter-turn to move it to its locked position, the springs under the top plate and the gasket seal 36 are compressed, while the pin 65 rides down along the spiral cam and locks into a detent at the end of the spiral cam. The pin 65 in the bearing block can travel freely up and down in the slot 66. The pin travels up and down with the top plate when a vacuum is applied to or released from the interior of the fixture. FIG. 4A is a top view showing projections 71 from opposite sides of the quick-release head 70 indicating whether the locking post is in its locked or open position. When the posts in the four corners are loosened, the board is held in a fixed position spaced above the tips of the test probes. When the posts are tightened the top plate is held firmly against the top of the gasket seal while the probes remain spaced from the underside of the board. When the posts are tightened and a vacuum is drawn, it compresses the peripheral bottom portion of the moving top plate against the compressible annular gasket 36. This forms an airtight vacuum seal around the bottom perimeter of the moving top plate. This also compresses the board into contact with the test probes. Each post can be loosened for removing the post from the linear bearing. The top plate can be removed by removing the four posts in the four corners of the top plate.

FIG. 3 shows narrow x and y dimensions representing narrow distances along the four edges of the vacuum well over which top plate movement is available in both x and y directions. The top plate also can be rotated in a z direction by combined x and y movements. These movements allow the board to be aligned with the probe field before the vacuum is applied during testing, as described below. The top plate can be moved in the x, y and z directions (the movement, is within the plane of the top plate) while the posts in the corners of the top plate are latched in place in the linear bearings.

The bearing block 50 and the linear bearing 46 are movable as a unit relative to the bottom face 57 of the probe plate 26. The bearing block is secured to the bottom of the probe plate by fasteners 72 which screw into corresponding internally threaded receptacles 74 in the bottom face of the probe plate. The fasteners are accessed through holes 76 facing down toward the bottom side of the bearing block. (The holes are shown counter-bored. Alternatively, the fasteners can be exposed at the bottom face of the bearing block.) The fasteners are initially screwed into the receptacles 74 in a loosened condition that holds the bearing block to the bottom of the probe plate while allowing the bearing block to move or "float" in all directions relative to the probe plate. This allows the linear bearing which is carried by the bearing block a complete freedom of movement within the oversized passage 52 through the probe plate. When the board under test is initially positioned on tooling pins (not shown) affixed to the moving top plate, the board is held in a fixed position relative to the top plate. The board position then can be adjusted to align the board with the probe field. The quick-release latch posts are engaged in the bearings which are but held in a loosened position. The quick-release latch in each bearing is tightened. As illustrated in FIG. 3, the top plate is freely movable relative to the probe plate (in x or y directions or z-axis combinations thereof) because of the movable bearings. The board is aligned to the array of test probes by moving the top plate and bearing block as a unit together with the bearing sleeve which is able to float inside the oversized passage 52. Once the board is properly aligned to the test probes, the bearing block then can be securely fastened to the base of the fixture by tightening the screws via access from the base of the bearing block.

This arrangement allows for a quick means of precisely adjusting the board in its positional orientation with respect to the probe field and then securing the linear bearings in place to ensure the proper alignment. The quick-release latch, once engaged, allows for smooth vertical guided travel of the latch sleeve inside the linear bearing sleeve during vacuum operation. Further, the four linear bearings in the corners of the probe plate are outside the vacuum area. This simplifies the bearing assembly in that O-ring seals, or the like, are not needed to be part of the bearing assembly to maintain any vacuum seal at the bearing level. This simplifies the bearing assembly structure and the means provided for making position adjustments of the moving top plate.

The gasket seal 36 shown in FIGS. 2 through 4 is a compressible gasket preferably of solid rectangular cellular cross-section. The gasket is a continuous piece rather then being glued together in sections or the like. The preferred gasket material is an open-cell, micro-cellular urethane elastomer; a presently preferred gasket material is the cellular urethane sold under the name Poron by Rogers Corporation. The gasket material has high energy absorption and good resistance to a compression set. It is also easily die cut into the desired configuration by water jet cutting, for example. This reduces labor costs in manufacturing the seal. Because of its dimensional stability, the gasket need not be seated in a deep molded or routed-out groove around the perimeter of the vacuum well. A shallow recess 78 shown in FIG. 4 can seat the gasket. Preferably, the gasket is arranged in the vacuum well recess so that a majority of its cross-sectional height extends above the base 26 of the probe plate. The dimension stability of the gasket supports the bottom peripheral portion of the moving top plate so that the top plate can float in movement relative to the gasket seal. This allows the flat bottom surface of the moving top plate to rest on the gasket seal and slide smoothly back and forth across the flat upper surface of the gasket seal continuously around the entire periphery of the seal when position adjustments are made for the floating top plate relative to the seal and the underlying vacuum well. The drawings show a continuous flat bottom surface on the moving top plate; in an alternative embodiment, a continuous 0.030 inch peripheral step can extend down from the outer perimeter of the top plate.

FIG. 5 illustrates an alternative form of the invention. This view shows a test fixture top plate 28 resting on the peripheral gasket seal 36 which extends around the periphery of the vacuum well and the probe plate 26. A circuit board 80 is mounted on a continuous compressible peripheral gasket 82 atop the moving top plate. The gasket can be made of the same compressible cellular elastomer as the vacuum seal 36. Tooling pins, shown schematically at 84, engage tooling pin holes precision-drilled in the board for holding the board in a fixed position on the top plate. An array of spring loaded test probes (not shown) mounted in the probe plate extend through access holes in the top plate for contact with the underside of the board under test. Linear bearing assemblies 86 are located in the four corners of the fixture to support the moving top plate for guided movement toward and away from the probe plate during vacuum operation in a manner similar to the bearing assemblies 34 described previously. Only one of the bearing assemblies 86 is shown in FIG. 5 for simplicity. In this embodiment of the bearing assembly, a linear bearing sleeve 88 is mounted to a bearing block 90. The bearing sleeve 88 is made from the same hard plastic composite material with a naturally lubricated inside diameter described previously. The bearing block includes access holes 92 in its base for receiving fasteners 94 that screw into corresponding internally threaded holes 96 in the base of the probe plate. Teflon spacers 98 are at the interface between the bearing block 90 and the bottom face 57 of the probe plate 24. The linear bearing sleeve 88 extends upwardly from the bearing block into an oversized hole 100 in the probe plate so that the linear bearing can move as a unit with the bearing block with 360 degrees freedom of rotation within the oversized hole 100. When the threaded fasteners 94 are threaded into the holes 96 in the probe plate they engage flat washers 102 that bear against shoulders 104 inside the bearing block. When the fasteners 94 are tightened against the shoulders 104, the bearing block and the linear bearing sleeve 88 can be held in a rigid fixed position relative to the probe plate. If the fasteners 94 are loosened slightly, they can retain the bearing block on the base of the fixture and hold the bearing sleeve 88 in a fixed position inside the oversized hole 100, but allow for a small freedom of movement or "floating" of the bearing block and sleeve relative to the hole 100. A latch pin 106 is shown schematically in the circular vertical passage through the interior of the bearing 88. This latch pin 106 schematically represents any of various forms of latch pins (described below) for securing the moving top plate 28 to the linear bearing assemblies. When the bearing blocks are loosened, the top plate, latch pins, bearings, and bearing blocks are movable as a unit relative to the probe plate. This allows the board under test to be shifted to precisely align test points on the board with the test probes. Once the board is aligned (In some instances the bearing blocks need not be pinned in place during testing. They can remain loosened) the bearing blocks can be tightened in place. When vacuum is applied during testing, the bearings guide vertical travel of the top plate and the seal is compressed to retain the vacuum beneath the top plate. The bearings are isolated from the vacuum within the vacuum chambers.

The embodiment of FIG. 5 illustrates a technique for precisely aligning the test probes with the board under test, in which the top plate is moved relative to the probe plate and the vacuum seal by an external motor drive represented schematically at 108. In this arrangement an external alignment system can be used to set reference points with which corresponding indexing marks on the board are aligned to precisely align test points in circuits on the board with corresponding spring probes in the fixture. The top plate is then moved to move the board so as to align the indexing marks on the board with the fixed reference points in the external alignment system. The indexing marks on the board can be conventional fiducial marks precision-printed at known fixed positions on the board relative to the circuit array printed on the board. One such alignment system to be used with the arrangement can be an optical alignment system disclosed in PCT Application US91/03688, published 12 Dec. 1991 under Publication No. WO91/19392, entitled "Test Fixture Alignment System," assigned to the assignee of this application, and incorporated herein by this reference. The top plate is freely movable in orthogonal x or y axis directions or in the z axis rotational directions (combinations of x and y axis movements). The latch pins 106 are initially latched in the linear bearings 88 to secure the moving top plate to the linear bearings carried by the bearing blocks. Thus, the bearing blocks, the linear bearings and the latch 106 together with the top plate move as a unit during alignment. The clearance hole 100 in each linear bearing assembly provides 360 degrees of clearance around the exterior of each bearing 88 to permit movement of the bearing within the clearance hole to any position therein necessary to make the required alignment between the indexing marks and the reference points, to automatically align the probes with the circuits on the board. The movement of the top plate is by the external computer-controlled motor drive 108 which connects to a rigid arm 109 affixed to the moving top plate for automatically applying the forces in the proper directions to move the top plate. During this movement of the top plate relative to the probe plate, the bearing blocks 90 in each bearing assembly are loosened with respect to the probe plate by loosening the connections between the fasteners 94 and the threaded receptacles 96 in the base of the probe plate. These connections remain loosened at all times during alignment and during vacuum operation of the test fixture inasmuch as each board can be independently aligned by the optical alignment system through each board's freedom to move relative to the probe field. The rigid arm 109 and its connection to the drive system provides the rigidity to hold the top plate in place after the top plate is aligned. The linear bearings provide a means for guiding the latch pin 106 during vertical travel in the bearing sleeves (during vacuum operation) without binding.

The arrangement for moving the top plate during the optical alignment process is depicted schematically in FIG. 5. FIGS. 21-29, described below, show details of a preferred motor drive system for automatically aligning the top plate to the probe field in response to sensed alignment information generated by the optical alignment system.

FIG. 5A illustrates an alternative linear bearing system and a means for pinning the bearing blocks 90a to the fixture. In the system shown in FIG. 5A, the bearing block 90a retains the linear bearing 88a. The shaft shown schematically at 106a slides vertically in the bearing 88a as in previously described embodiments. Fasteners 94a retain the bearing block but remain loosened in fittings 96a to permit freedom of movement to the adjusted position. Teflon slid sheets 98a assist freedom of movement of the bearing blocks relative to the moving top plate. The linear bearing is disposed in an oversized hole 10a and the fasteners 94a are in oversized 94b. The bearing block is retained by a separate base plate 90b and self-locking nuts 94c. In this embodiment, a separate screw-threaded pin 110 is located in each bearing block adjacent each quick-release latch mechanism (shown schematically at 34a). If an optical alignment system is not used, the bearing blocks can be pinned to the fixture by pins 110. Alternatively, after the optical alignment system is used and the optical alignment drive is detached from the moving top plate, each bearing block can be pinned to the fixture base by the pins 110 to retain the alignment. In a preferred arrangement, each pin 110 is accessed through a separate access hole 111 located in the top plate 28 adjacent each latch mechanism 34a. The access holes are also shown in FIG. 1. Each access hole allows passage of a tool for turning a screw head 110a of the pin 110. The pins can remain loosened while the top plate 28 is shifted to its correct position (by the optical alignment system). The pins are then tightened from access through the holes 111 to rigidly pin the bearing blocks in a fixed position. The pins include self-locking nuts 110b that lock the pins 110 when they are tightened from above. Thus, access for pinning the bearing blocks 90a is entirely from the top side of the fixture. This eliminates opening the fixture to set the positions of the bearings after the top plate has been aligned by the optical alignment system.

In an alternative form of the invention, the bearing blocks themselves can be pinned to the probe plate, either in instances where the optical alignment system is not used, or after the optical alignment system is used to align the top plate to the probe field. (When using the optical alignment system, the bearing blocks are not permanently pinned; they are loosened during the alignment process.) The system of pinning depicted in FIG. 5A is preferred with optical alignment procedures because access to the locking pins 111 is unobstructed from the top side of the fixture.

Figures 6, 7, 8:
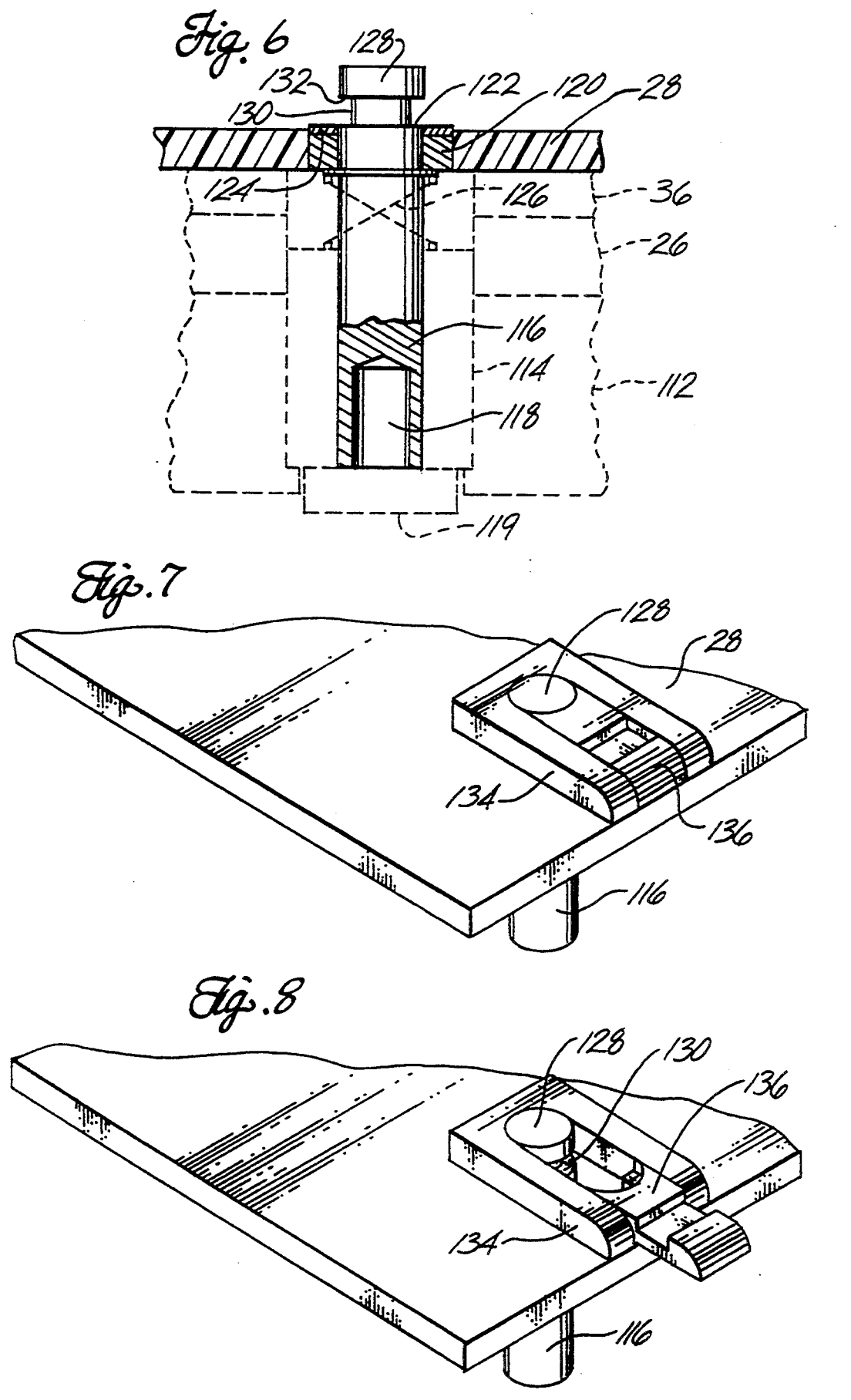

FIG. 6 shows an embodiment of a quick-release latch system which can be used with each linear bearing assembly. This embodiment schematically shows the moving top plate 28, the compressible gasket seal 36, the probe plate 26, and a bearing block 112 which carries a linear bearing 114. Preferably, the linear bearing is a hard plastic sleeve similar to the linear bearings described previously. An upright guide post 116 is rigidly affixed within the inside diameter of the bearing. A thumb screw 118 screws into the base of the guide post and a thumb screw head 119 is tightened against the bottom of the linear bearing block to hold the guide post captive between the bearing and the shoulder on the guide post. The top portion of the guide post is affixed to the top plate. The bushing rigidly fastens to the top plate and prevents side-to-side movement of the top plate relative to the guide post. The steel bushing has a hole through it which is removably disposed around the outside of the guide post. An annular metal bushing 120 surrounds an upper portion of the guide post at the level of the moving top plate. An annular steel shim 122 and annular rubber bushing 124 are secured to the upper portion of the guide post above the steel bushing. The shim rests on the rubber bushing. The rubber bushing normally permits a small amount of slack with slight up and down movement of the top plate relative to the guide post. A return spring 126 surrounds an upper portion of the guide post between the top of the bearing and the underside of the metal bushing 120. The top portion of the guide post above the top plate includes an enlarged head 128 above an annular recess 130 to form an annular shoulder 132 rigidly affixed in a position spaced above the upper surface of the top plate. The return springs hold the top plate above the gasket seal.

FIGS. 7 and 8 show a latch mechanism for rigidly connecting the moving top plate 28 to the upper portion of the guide post 116. In this embodiment of the latch mechanism, a U-shaped guide frame 134 surrounds the head 128 of the guide post above the top plate. A spring loaded latch 136 slides within the U-shaped guide 134. The latch 136 can be pulled manually outwardly against the bias of the compression spring, as shown in FIG. 8, for use in releasing the top plate 28 from the upper portion of the guide post. The bias of the spring moves the latch into engagement with the annular slot 130 formed beneath the shoulder 132 of the head 128 on the guide post. This engagement between the spring biased latch and the recessed region 130 of the guide post releasably locks the top plate to the guide post. This latching to the post also applies downward pressure on the rubber bushing to compress it and take up any slack between the top plate and the guide post. This holds the top plate in a fixed position on the guide posts. When a vacuum is drawn from beneath the moving top plate, the top plate will be pulled downwardly to compress the spring 126 and compress the bottom of the top plate against the gasket seal 36. The guide post provides smooth vertical guided travel in each corner of the probe plate and the moving top plate. In this embodiment, access to the linear bearing guide post and latch is solely from above the moving top plate. The top plate can be removed by releasing the latches to free the top plate for sliding off of the guide posts. Thus, and it is not necessary to access the underside of the bearing block to release the top plate from the probe plate.

FIGS. 9 and 10 shown an alternate form of the spring-biased latch of FIGS. 8 and 9. In the FIG. 9-10 embodiment the head 128 of the guide post 116 is latched to the top plate 28 by a spring-biased latch plate 140 having a U-shaped groove 142 facing the guide post head. An inwardly projecting U-shaped shoulder 144 inside the U-shaped groove 142 is engaged with the annular groove 130 in the post under the pressure of the latch return spring. FIG. 9 shows the latched position. FIG. 10 shows the released position in which the latch is manually pulled away from the guide post against the bias of the internal return spring. A pair of screw threaded posts 146 projecting upwardly from the top plate act as guides in elongated parallel guide slots 148 in the latch for guiding travel of the latch between its lock and unlocked positions.

FIGS. 11 through 13 illustrate an embodiment of a quick-release latch having a cylindrical molded plastic cap 150 that rotates about an axis through an upright pin 152. The pin is affixed to and extends above the top face of the moving top plate 28. The guide post 116 described previously has its locking head 128 projecting above the top surface of the top plate and into an arcuate open slot 154 in a side portion of the cap spaced from the axis of the pin 152. The slot has an inwardly projecting curved shoulder 156 on both sides which engages the annular recess 130 beneath the head 128. The inwardly projecting shoulder 156 extends around most of the length and on both sides of the slot but is omitted in a clearance area 158 at one end of the slot. FIG. 11 shows the guide post head 128 extending through the clearance region 158 of the slot; and in this position, the cap can be released from the guide post for use in removing the top plate. To latch the top plate to the probe plate, the cap is placed over the locking head 128 of the guide post and engaged in the slot 154. The cap then can be rotated about the axis through the pin 152 in the direction shown in FIG. 11. This causes the locking shoulder 156 on the arcuate slot to engage the underside of the locking head 128. Completed turning of the latch to the locked position shown in FIG. 13 securely fastens the quick-release latch in its locked position with the locking shoulder 156 retained in the recessed region 130 beneath the head 128 of the guide post 116. In this position the latch retains pressure on the top plate by compression of the rubber bushing. The guide post engages the tubular bearing to provide for smooth guided vertical travel of the top plate during vacuum operation. Removing the caps releases the top plate for removing it from the guide posts.

FIGS. 14 and 15 illustrate an alternative form of a quick-release latch in which a removable cylindrical molded plastic cap 160 latches to the locking post 128 on the guide post 116. FIG. 14 illustrates the cap having an enlarged slotted opening 162 that fits around the locking head 128 of the latch. Inwardly projecting shoulders 164 are on opposite sides of a narrowed channel beneath the slot 162. The cap 160 is entirely removable from the locking head 128, as shown in FIG. 14, and can slide over the locking head to hold the guide post in its locked position on the probe plate. In this embodiment the guide channels 164 are engaged in the reduced diameter recess 130 beneath the locking head 128 to hold the guide posts to the probe plate.

FIGS. 16 and 17 shown an alternative arrangement for locking and unlocking the moving top plate 28. In this embodiment a locking pin 165 extends through the sleeve 60 which is fixed to the top plate 28. The sleeve is affixed to the bearing block 50 which carries the linear bearing 46 as described previously. The top of the locking pin 165 has a lever 166 with a cam 167 engaging a step in the head of the sleeve. The cam lever rotates about an axis 166a. The bottom of the pin carries a compressible annular gasket 168 positioned between the bottom of the sleeve and a fitting 169 affixed to the bottom of the pin. When the lever is in the upright unlocked position shown in FIG. 16, the gasket 168 is not compressed, and the pin can move freely through the bearing 46. When the lever is rotated to the locked position shown in FIG. 17, the cam is forced into engagement with the step which shortens the effective length of the pin and compresses the gasket between the bottom of the sleeve and the fitting. This holds the top plate in a releasable locked position on the fixture.

FIGS. 17A through 17D illustrate an alternative cam operated locking latch referred to as a tab lock pin. In this embodiment, a shaft 360 carries a top cam 361 which rotates on an axis 362 through a vertical pin 363. At the bottom of the rotatable pin an offset tab 364 projects to a position offset from the side of the shaft. A gasket or spring 365 is located between the tab and the bottom of the shaft. A locking pin 366 in an upper portion of the shaft is offset from the axis of the pin 363. The locking pin 366 engages a detent in the underside of the top cam 361 to lock the cam against rotation. FIGS. 17A and 17B show the locked position of the latch, locking together the top plate and the probe plate. The latch is released by pulling up on the top cam to rotate it over the locking pin as shown in FIGS. 17C and 17D. This moves the tab in line with the shaft so the shaft can move freely through the linear bearings. The gasket or spring 365 is compressed when the latch is rotated to its unlatched position.

Figure 18:
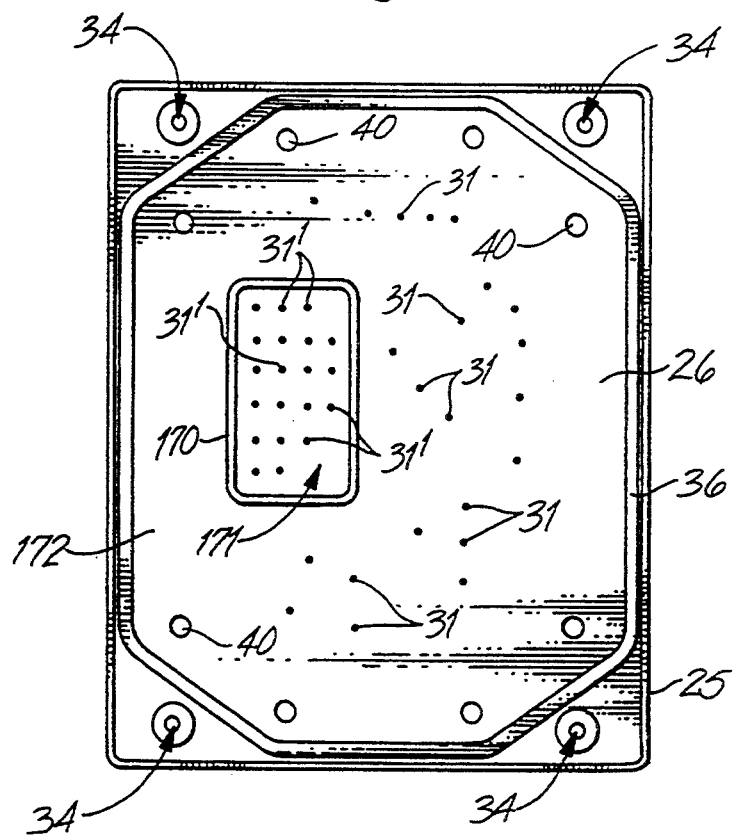
FIG. 18 is a semi-schematic top view illustrating a double vacuum seal arrangement for isolating a portion of the probe field.
Figure 19:
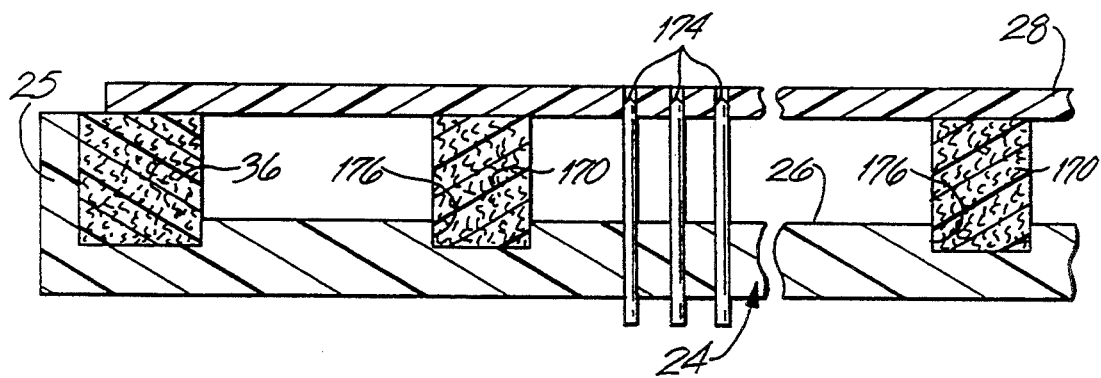
FIG. 19 is a fragmentary cross-sectional view of the double vacuum seal arrangement shown in FIG. 18.

FIGS. 18 and 19 show an annular secondary seal 170 which can be used to isolate a portion of the vacuum region within the test fixture. For example, FIG. 18 shows a plurality of test probe access holes 31' in the probe plate 24. The access holes can be used for test probes 174 that contact a certain region of the board under test. In situations where the test probes in the holes 31' contact an integrated circuit device, such as a surface-mount device, or other circuit device on the board which should not be subjected to substantial vacuum pressure during testing, the secondary vacuum seal can isolate the space 171 within the seal 170 from vacuum applied in the annular space 172 inside the vacuum well surrounding the secondary seal. This vacuum area 172 can be used to mechanically draw the moving top plate into contact with the probes during testing while the test probes within the space 171 are isolated from the vacuum. The seal 170 can be made of the same cellular material as the gasket seal 34, preferably the Poron material. The secondary seal can rest in a shallow routed-out recess 176. (A further "twin seal" arrangement is shown in FIG. 21 and described in more detail below.)

Figure 20:
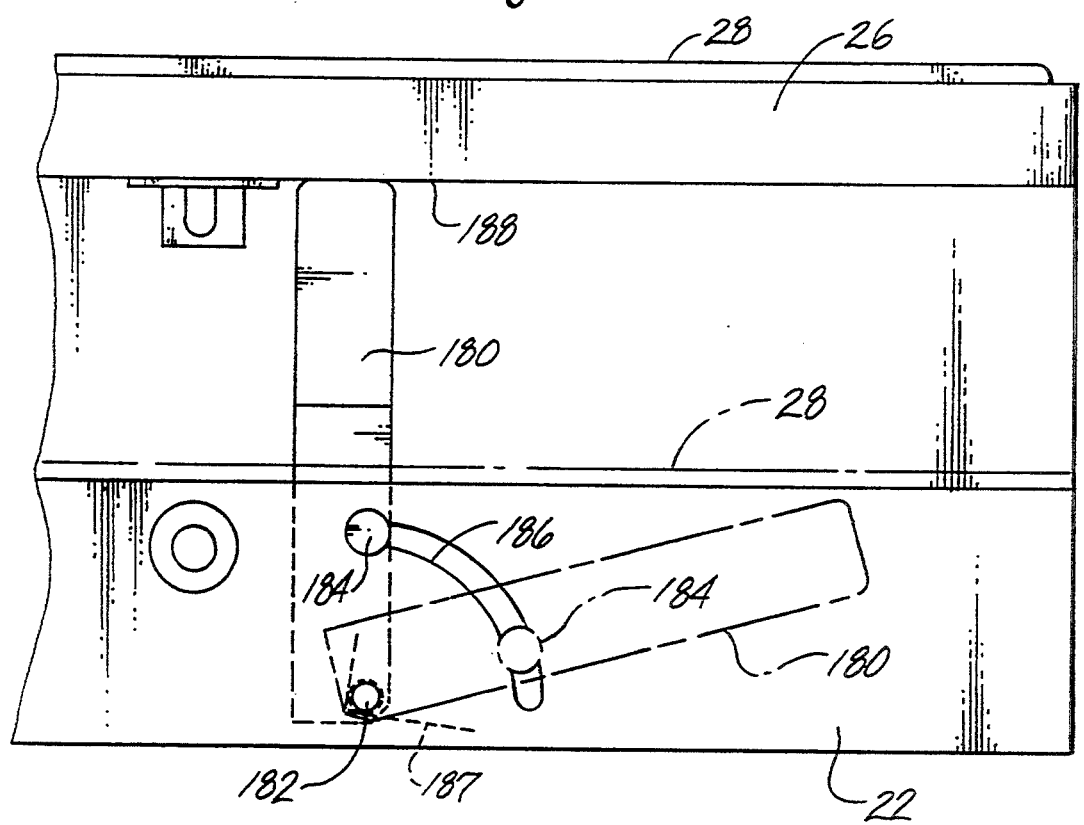
FIG. 20 is a fragmentary, semi-schematic front elevation view illustrating a safety arm support for the exterior of the fixture housing.

FIG. 20 illustrates a spring-loaded safety catch that prevents the hinged vacuum well assembly from causing inadvertent injury to the user. The vacuum well assembly, which includes the probe plate 24 and the moving top plate 28, is hinged to rotate to an open position above the base plate 22. This provides access to the test probes on the underside of the probe plate. The safety catch includes a rigid metal bar 180 having a hinge pin 182 at its base for rotatably securing the bar to a lower front portion of the base plate. The hinge pin is rigid to resist axial pressures on the opposite end of the bar. An access pin 184 carried on a front face of the bar projects through a curved slot 186 on the front face of the base plate. The access pin is used for manually rotating the bar 180 between a rest position illustrated in phantom lines and an upright operative position shown in solid lines. The safety catch bar has a return torsion spring shown schematically at 187 for use in normally forcing the safety bar to its upright position. When the hinged vacuum well assembly is rotated to its open position, the safety catch bar 180 rotates to its upright operative position under the force of the spring 187 with the top edge of the bar spaced well above the bottom edge 188 of the vacuum well assembly. The vacuum well is normally held in its fully open position by spring pressure, but an inadvertent downward force can cause the assembly to rotate downwardly quickly and possibly hit the user's fingers. The safety catch bar 180 avoids this problem. In its operative position it resists downward movement of the vacuum well assembly to retain the vacuum well in a partially hinged open position. The safety catch bar 180 is rotated downwardly to its rest position when the hinged vacuum well assembly is rotated to its closed position.

In one embodiment, the top lid of the fixture can be retained in a fixed angular open position by one or more gas springs (not shown). When the fixture is opened the gas spring can limit travel of the top lid to say less than about 60°. If accessories (such as a hold-down gate) are added to the top lid they can change the center of gravity if the lid rotates open to a 90° angle. The gas spring avoids such a center of gravity shift.

Figure 21:
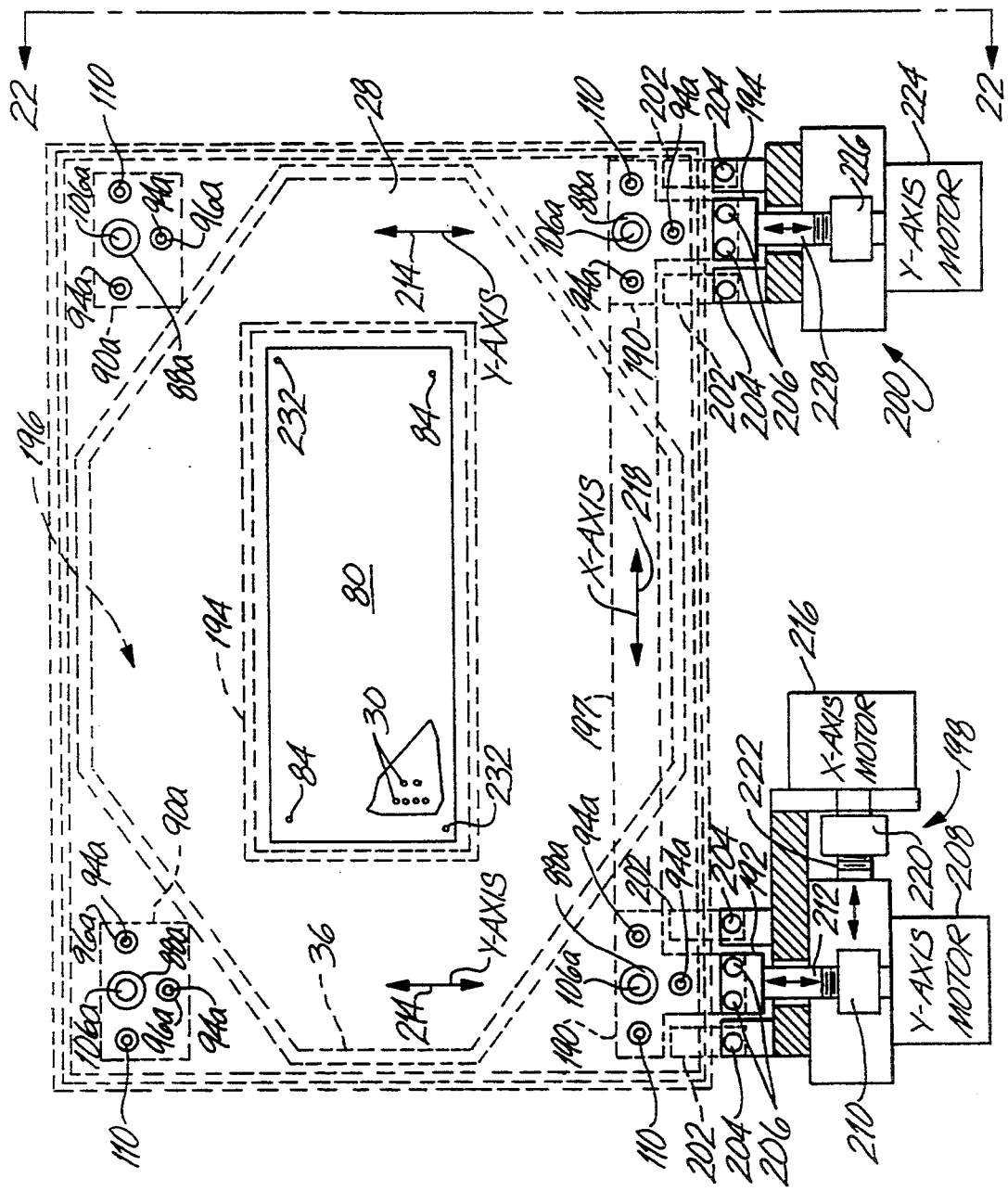
FIG. 21 is a schematic top view showing an X-Y axis motor drive for use in aligning the top plate of the test fixture in response to position adjustment information from an optical alignment system.
Figure 22:
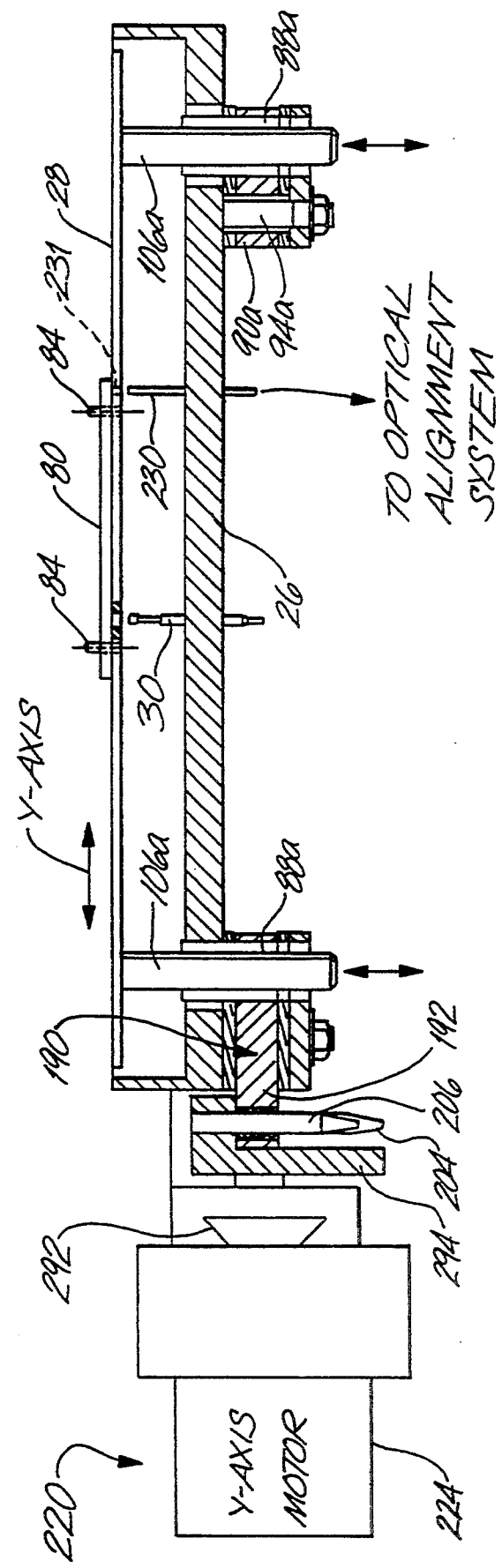
FIG. 22 is a schematic cross-sectional side view taken on line 22—22 of FIG. 21.
Figure 23:
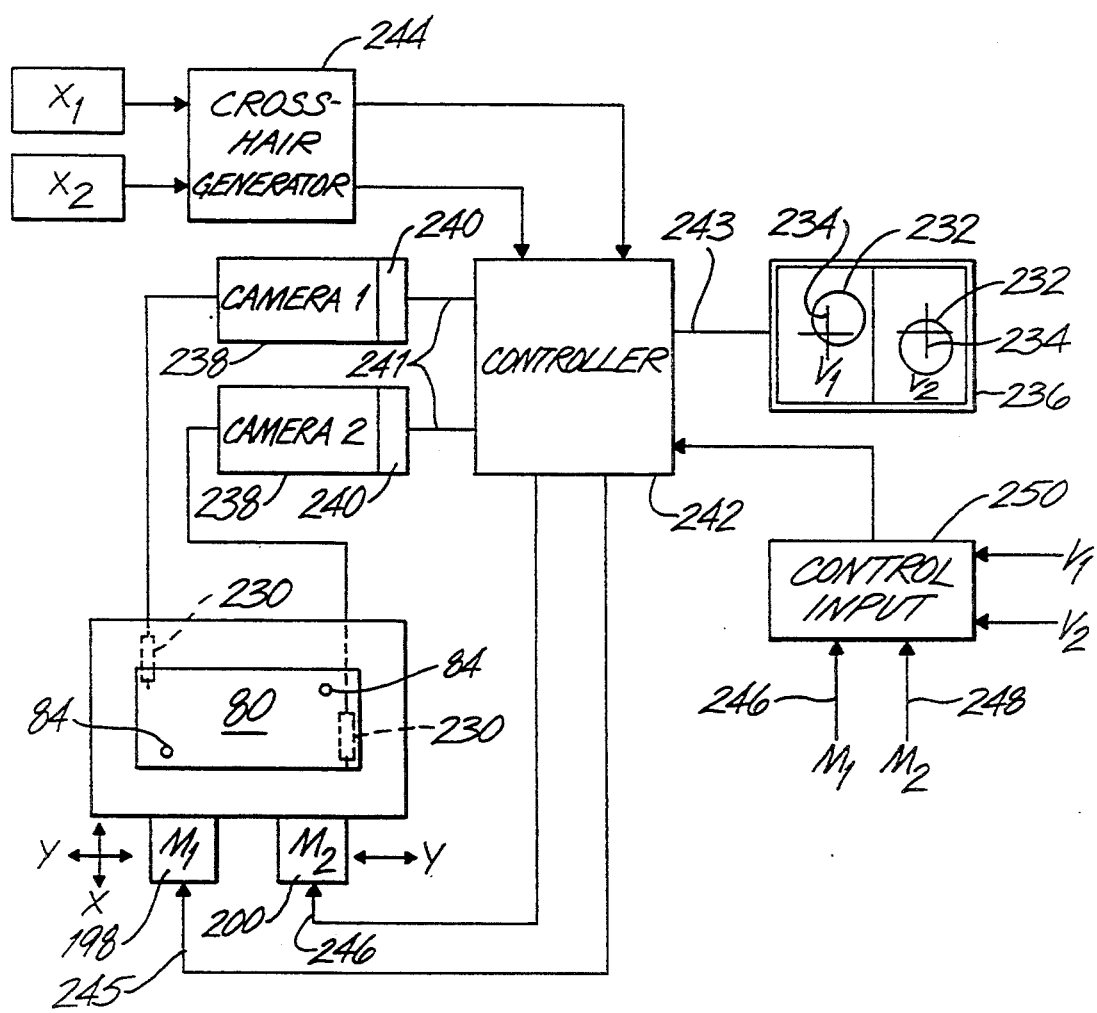
FIG. 23 is a schematic functional block diagram illustrating electronic components of the test fixture alignment imaging system and motor drive for automatically providing the alignment.

FIGS. 21 to 29 illustrate one embodiment of an X-Y axis motor drive system for automatically shifting the top plate 28 into correct alignment with the probe field on the fixture so that circuits on the board under test will be correctly aligned with the probes 30. Any misalignment of the board relative to the probe field is sensed by an optical alignment system such as that disclosed in PCT Publication WO 91/19392, referred to above. FIGS. 21 through 23 schematically illustrate one embodiment of the test fixture and linear bearing system used in cooperation with an embodiment of the optical alignment system. The bearing system shown for purposes of illustration is similar to that described previously with reference to FIG. 5A. This bearing system includes the movable bearing blocks at the four corners of the fixture. Each bearing block includes a linear bearing sleeve 88a and the fasteners 94a for being loosened to allow the freedom of movement of the bearing blocks while the top plate 28 is shifted during use of the optical alignment system. Each bearing block also is shown with its locking pin 110 for use in pinning the bearing blocks to hold the alignment after the top plate is moved and the board under test is correctly aligned to the probe field by the optical alignment system.

Briefly, the fixture includes bearing blocks 90a at the rear corners of the fixture. These bearing blocks are similar to those described previously with reference to FIG. 5A. A separate pair of bearing blocks 190 at the front corners of the fixture are modified to include an extension arm 192 coupled to separate drive motors for use in automatically moving the top plate into alignment as described below. The bearing blocks 190 are otherwise similar to the rear bearing blocks 90a in that they include the fasteners 94a for allowing freedom of movement of the bearing block relative to the top plate; and they also include the linear bearing 88a and shaft 106a, described previously, as well as the pins 110 for use in pinning the front bearing blocks when the optical alignment has been completed.

The system shown in FIG. 21 also includes the annular outer gasket 36 which provides an outer seal between the underside of the moving top plate 28 and the top of the probe plate 26. As described previously, this vacuum seal isolates the vacuum area from the movable bearing blocks which are outside the vacuum area. In the embodiment illustrated in FIG. 21, the printed circuit board 80, which is mounted to the top of the top plate 26, is also isolated in its entirety from the vacuum area. In this embodiment, a vacuum seal 194 made of a material similar to seal 36 is secured to the underside of the moving top plate. The bottom of the seal 194 fits into a shallow recess of matching configuration in the upper surface of the probe plate. When a vacuum is drawn, an annular vacuum area 196 is formed between the seal 194 and the seal 38 so that the circuit board under test is completely isolated from the vacuum area.

Referring now to the optical alignment system, and particularly with reference to FIGS. 21 and 22, a pair of hand-held drive motors are attached to the extension arms 192 of the bearing blocks 190 at the front corners of the fixture for use in automatically shifting the alignment of the top plate relative to the test probes on the fixture base. The front bearing blocks 190 are rigidly affixed to a rigid transverse bar 197 which extends laterally across the front of the fixture below the probe plate 24. The bearing blocks 190 are mounted between the Teflon slide sheets so the front bearing blocks 190 and the transverse bar 197 are tied together as a rigid unit and move in unison relative to the top plate. The attachment of the bearing blocks to the fixture base allows for vertical sliding travel of the top plate in the plane of the top plate only, while motion in the vertical direction or rocking motion of the top plate is prevented. As mentioned previously, the shafts 106a affixed to the bottom of the moving top plate are aligned in the linear bearings 88a so that any movement of the front bearing blocks will automatically move the top plate. The bearing blocks 90a at the rear corners of the fixture remain in a loosened condition during optical alignment, and the shafts 106a on the moving top plate which are engaged with the linear bearings in the rear bearing blocks are idle and follow the travel induced on the front bearing blocks by the optical alignment drive system. The extension arms 192 of the front bearing blocks are driven during the alignment process by an X-axis, Y-axis drive motor 198 in cooperation with a Y-axis drive motor 200. Each of these drive motors is contained within a separate hand-held housing adapted to be releasably connected to the front corners of the fixture prior to the optical alignment process. The narrow extension arm 192 from each front bearing block extends between a pair of fixed outer extension arms 202 rigidly affixed to the probe plate. The outer fixed arms 202 extend parallel to the movable arms 192 on the front bearing blocks which extend into the space between the outer extension arms 202. The outer fixed extension arms have vertically extending fixed pins 204 (described below) on the drive motors for connecting to corresponding receptacles on the fixture holding the drive motors in a fixed position at the front corners of the fixture during the alignment process. The fixed pins 204 on the drive motors can be removed from these receptacles when removing the motors from the front corners of the fixture. The extension arms 192 of the movable front bearing blocks are connected to a pair of vertically extending movable pins 206 that connect to receptacles on a movable carriage (described below) carried by the X-Y axis drive shafts of the drive motors 198 and 200. The alignment process using the drive motors is described in more detail below.

Referring now to the schematic representations of the drive motors 198 and 200 shown in FIG. 21, the X-axis, Y-axis drive motor 198 includes a Y-axis motor 208 having an internally threaded drive nut 210 which is rotated about its axis when the Y-axis motor 208 is driven. The drive nut 210 is engaged with an externally threaded fixed Y-axis shaft 212 rigidly affixed to the extension arm 192 of the bearing blocks shown at the front left corner of the fixture. When the Y-axis motor is driven, the drive nut 210 causes the Y-axis shaft 212 to move axially in the Y-axis direction shown at 214 in FIG. 21. The drive unit 198 also includes an X-axis motor 216 having an output shaft aligned on the X-axis shown at 218, at a right angle to the Y-axis shaft. The X-axis motor includes a drive nut 220 internally threaded and engaged with an X-axis fixed shaft 222 connected through internal gearing (described below) that causes the top plate to shift in the appropriate direction along the X-axis when the X-axis motor drives the drive nut 220.

The Y-axis drive unit 200 includes a Y-axis motor 224 for driving a Y-axis drive nut 226 connected to a fixed Y-axis shaft 228 affixed to the bearing block shown at the right front corner of the fixture.

During operation of the optical alignment system, as described in more detail below, the top plate can be moved in the X-axis, Y-axis, or can be rotated in the Z-axis as follows. Any alignment in the X-axis is produced by operating the X-axis motor 216 which will move the front extension arm 192 of the bearing blocks shown at the front left corner of the fixture. The entire top plate is affixed as a rigid unit to the X-axis drive so that input signals to the controller for the X-axis motor can drive the top plate to the left or right along the X-axis. Y-axis motion is produced by operating the Y-axis motors 208 and 224 in unison to move the top plate toward the front or toward the rear along the Y-axis 214. The Y-axis drive motors 208 and 224 also can be operated to produce Z-axis (rotational) motion of the top plate by rotating one Y-axis motor in one rotational direction and by rotating the other Y-axis motor in the opposite rotational direction. Corresponding input signals to the Y-axis motors can produce counterclockwise or clockwise rotation of the top plate in addition to forward or rear motion purely along the Y-axis.

Referring to FIG. 23, the optical alignment system in, a preferred form, includes a narrow diameter bore scope 230 (shown schematically in FIG. 23 and shown in position in the fixture in FIG. 22). The bore scope includes an optical fiber image guide for transmitting the image of a fiducial mark 232 on the board to a remote processing unit. The bore scope also includes optical fibers for transmitting light from a remote light source to the vicinity of the fiducial mark so that the fiducial mark can be illuminated. This enhances the image of the fiducial mark transmitted by the optical fiber image guide. The probe end of the bore scope is mounted in a fixed position on the probe plate 24 beneath the movable top plate 28. The probe has access to the fiducial mark through an opening 231 in the top plate 28. There are actually two bore scopes used, a separate one for imaging each fiducial mark 232, in diagonally opposite corners of the fixture. A small size diameter receptacle, preferably a standard 0.080 inch connector, mounts each bore scope to the probe plate. The moving top plate includes fixed tooling pins 84 inserted into tooling pin holes in diagonally opposite corners of the board under test. The tooling pins are rigidly affixed to the top plate and they hold the board in a fixed position above the top plate.

In use, the bore scope senses the position of each fiducial mark and produces an optical reading showing any misalignment of each fiducial mark relative to known zero reference point, shown at 234 on the screen of a monitor 236. Preferably, the images transmitted by each bore scope are input to separate miniature video cameras 238 located remotely from the test fixture. The video camera lens systems focus the transmitted images of the fiducial marks on a charge-coupled device (CCD) chip located at 240 in each remote video camera unit. The (CCD) converts the image from the video lens system into digital signals 241 processed by a video display system which includes a camera controller unit (CCU) in a controller 242. A coaxial video cable 243 transmits video signals to the TV monitor 236. Enlarged images of the fiducial marks are produced on the screen of the video monitor. The screen is split so that two screen sections $V_1$ and $V_2$ display each fiducial mark 232 in comparison to a corresponding fixed reference point 234 generated by a cross-hair generator 244. The optical alignment system publication WO 91/19392 describes calibration procedures for setting the fixed reference points. The output of the electronic cross-hair generator 244 is electronically coupled to the video cable and also displayed as the fixed reference points on the screen. Movement of the board causes the images of the fiducial marks to change on the screen relative to their corresponding fixed reference points. Any movement of the board relative to the probe field is displayed as a misalignment of the fiducial marks with respect to their fixed reference points. By moving the board relative to the probe plate (and therefore relative to the bore scopes), the images of the fiducial marks can be aligned with the fixed reference points. This automatically aligns the board with the probe field. In this embodiment, the tooling pins 84 of the top plate remain fixed and they, along with the board and the top plate, move in unison relative to the probe plate and the bore scopes.

As mentioned previously, the linear bearings of this invention provide a means for shifting movement of the top plate 28 with 360° freedom of movement during the optical alignment process. The linear bearings are retained in their loosened position during optical alignment procedures. In a preferred form of the invention, the moving top plate is shifted by the X-Y axis motor drive unit 198 and the Y-axis motor drive unit 200. Each drive unit is computer controlled to automatically move the top plate into correct alignment with the probe field. During use, the operator of the alignment system observes the relative alignments of the fiducial marks 232 with respect to the fixed reference points 234 and operates the motor drive units 198 and 200 to move the top plate until the fiducial marks and their corresponding fixed reference points are aligned. The motor drive units 198 and 200 are driven by control signals 245 and 246, respectively, output from the controller 242. Either or both of the motor drive units are driven in response to motor drive commands 246 and 248 input to a control unit 250. The motor drive systems will now be described.

Figure 24:
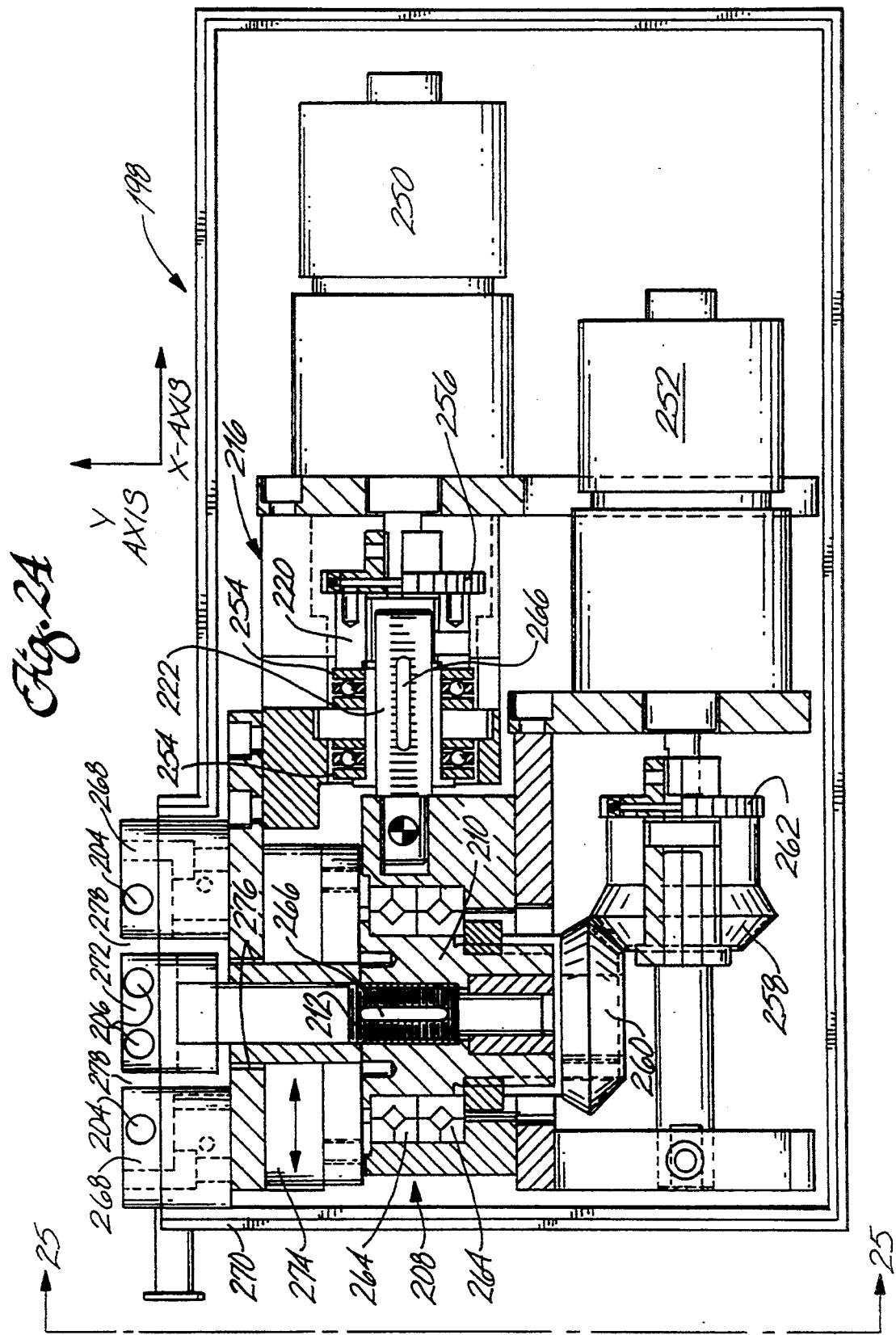
FIG. 24 is a semi-schematic cross-sectional view of an X-Y axis motor drive.
Figure 25:
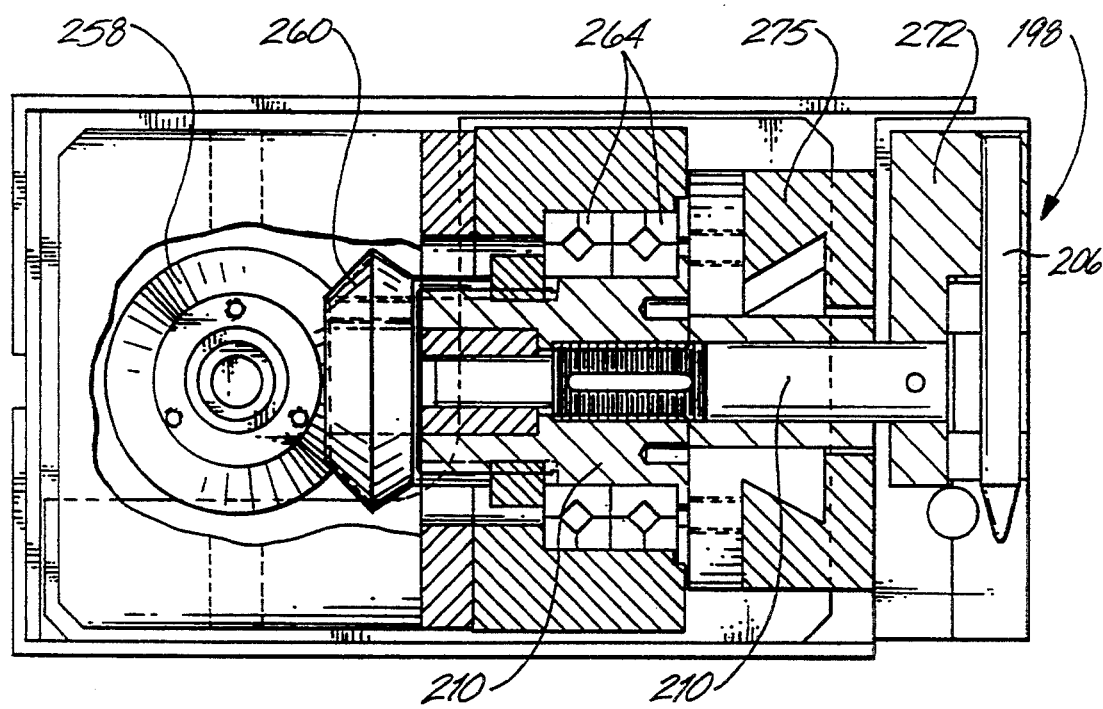
FIG. 25 is a semi-schematic cross-sectional view of the X-Y axis motor drive taken on line 25—25 of FIG. 24.

FIGS. 24 and 25 show the X-Y axis drive unit 198 which includes and X axis gear motor 250 and a Y axis gear motor 252. The X axis gear motor rotates the X axis drive nut 220. Thrust bearings 254 adjusted to zero clearance keep the drive nut 220 in a fixed position as it rotates about its axis. The screw-threaded X-axis shaft 222 is held in a fixed position without rotation. A flexible drive coupler 256 absorbs start-up and end-of-travel shock. Rotation of the X-axis drive nut moves the X-axis shaft 222 axially back and forth along the X axis.

The Y-axis gear motor 252 is coupled to the Y-axis drive nut 210 through right angle gears 258 and 260. A Y-axis flexible drive coupler is shown at 262. The gear 260 has its output shaft coupled to the Y-axis drive nut supported by zero clearance radial bearings 264. Rotation of the Y-axis drive nut moves the Y-axis shaft 212 axially toward or away from the drive nut in opposite directions along the Y axis. Anti-backlash segments 266 are carried on both the threaded shafts of the X and Y drive units.

Fixed mounting brackets 268 are spaced apart on opposite sides of the Y-axis shaft 212. The fixed brackets are rigidly affixed to the drive unit housing 270 and these mounting brackets carry the fixed pins 204 described previously. These pins 204 are used to mount the drive unit 198 to the front corner of the fixture. A movable pin mounting bracket 272 is carried on the end of the Y-axis shaft 212 between the two fixed mounting brackets 268. As the Y-axis shaft is moved in or out along the Y axis, the movable bracket 272 moves linearly with movement of the shaft 212. The movable bracket 272 carries the moving pins 206, described previously, which are connected to the bearing blocks at the front corners of the fixture.

The X-axis shaft 222 is rigidly affixed to a carriage 274 for translating the Y-axis shaft laterally in the X-axis direction during translation of the X-axis shaft 222. The carriage 274 includes a dovetail slide 275 which constrains the moving pin block 272 to movement only in the X axis. Clearance at 276 allows for translation of the Y-axis shaft 212 and its moving pin bracket 272 during alignment adjustments along the X-axis. Clearance at 278 between the moving pin bracket 272 and the fixed pin brackets 268 also allow for movement along the X axis.

Figure 26:
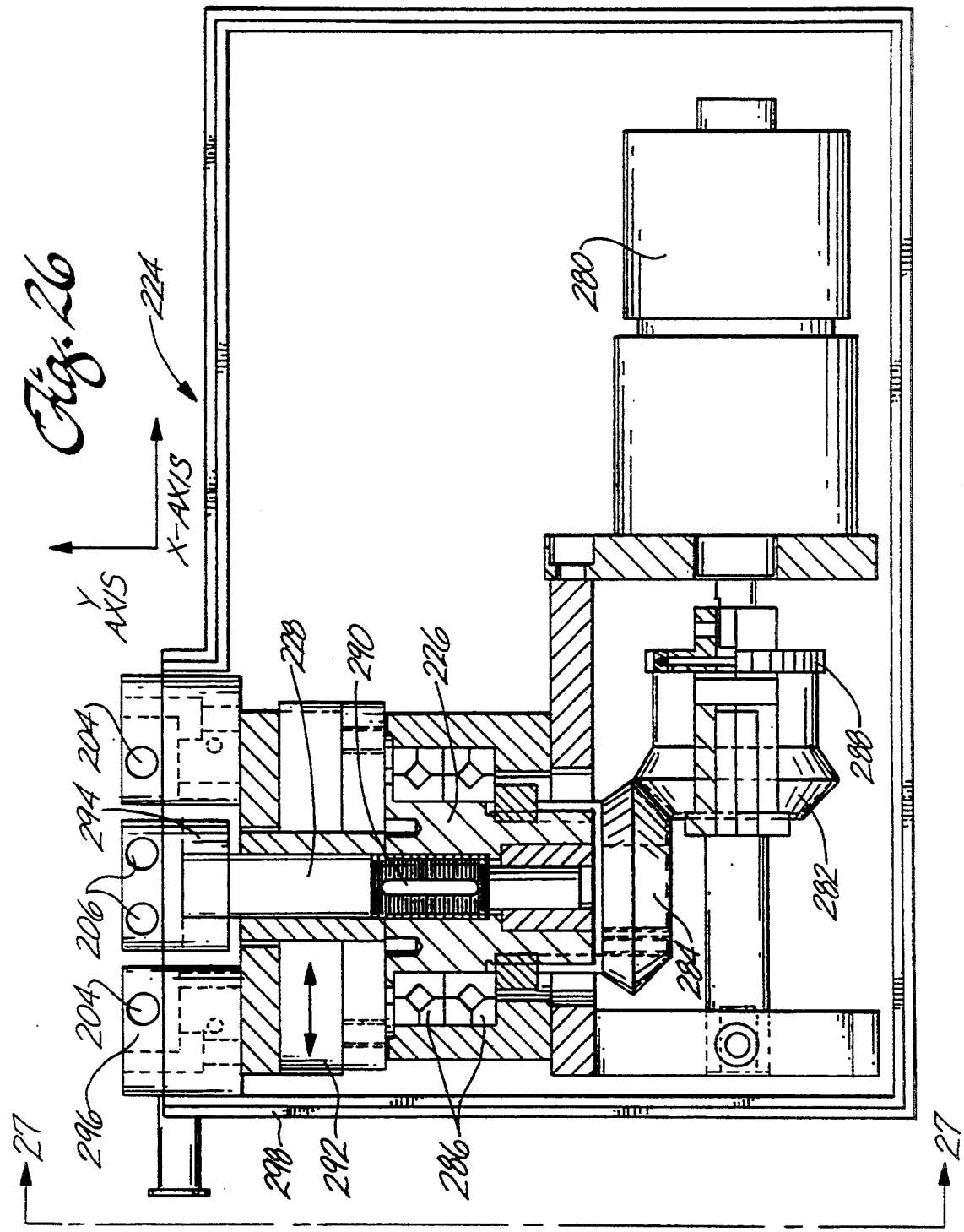
FIG. 26 is a semi-schematic cross-sectional view showing a Y-axis motor drive.
Figure 27:
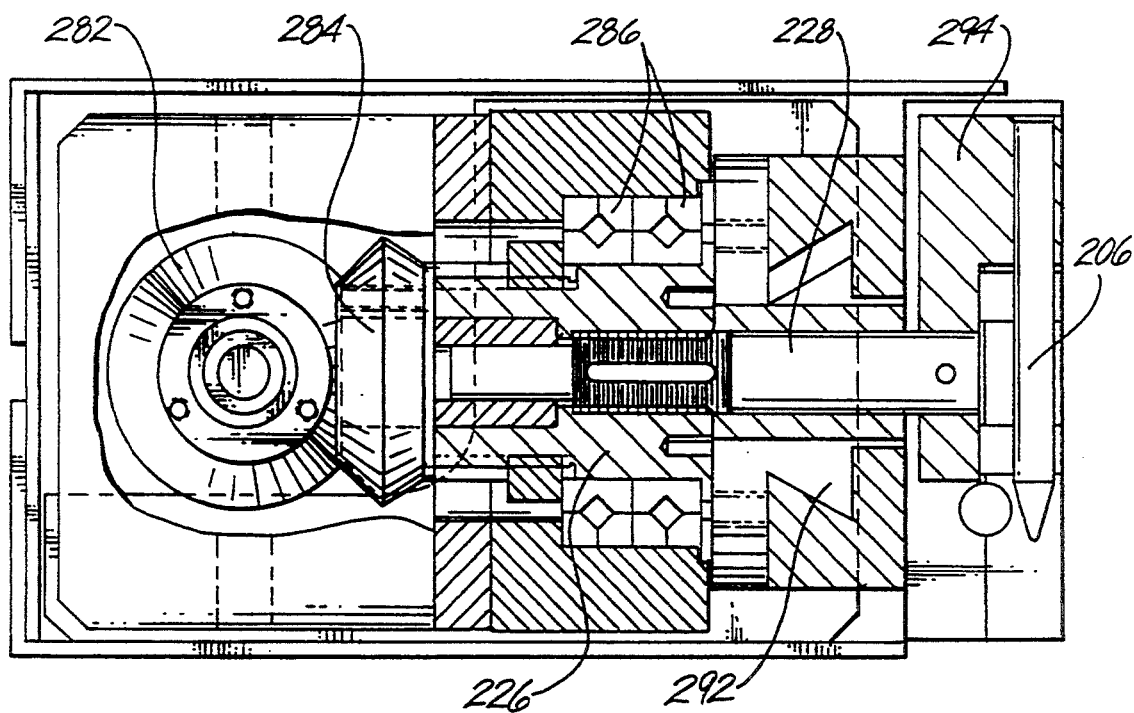
FIG. 27 is a semi-schematic cross-sectional view, partly broken away, showing a Y-axis motor drive taken on line 27—27 of FIG. 26.

Referring to FIGS. 26 and 27, the Y-axis drive motor 224 includes a Y-axis gear motor 280 having its output shaft coupled to the Y-axis drive nut 226 through intervening right angle gears 282 and 284. The drive unit also includes the zero clearance radial bearings 286, flexible drive coupler 288, and anti backlash segment 290 described previously. The Y-axis drive shaft 228 is carried on a dovetail slide 292 that allows free movement in the X axis while restricting Y-axis travel when the moving pin block 294 is driven in the X-axis direction. Fixed pin blocks 296 affixed to the housing 298 for the Y-axis drive carry the fixed mounting pins 204. The movable pin block 294 carries the pins 206 for connection to the bearing block at the right front corner of the fixture.

Figure 28:
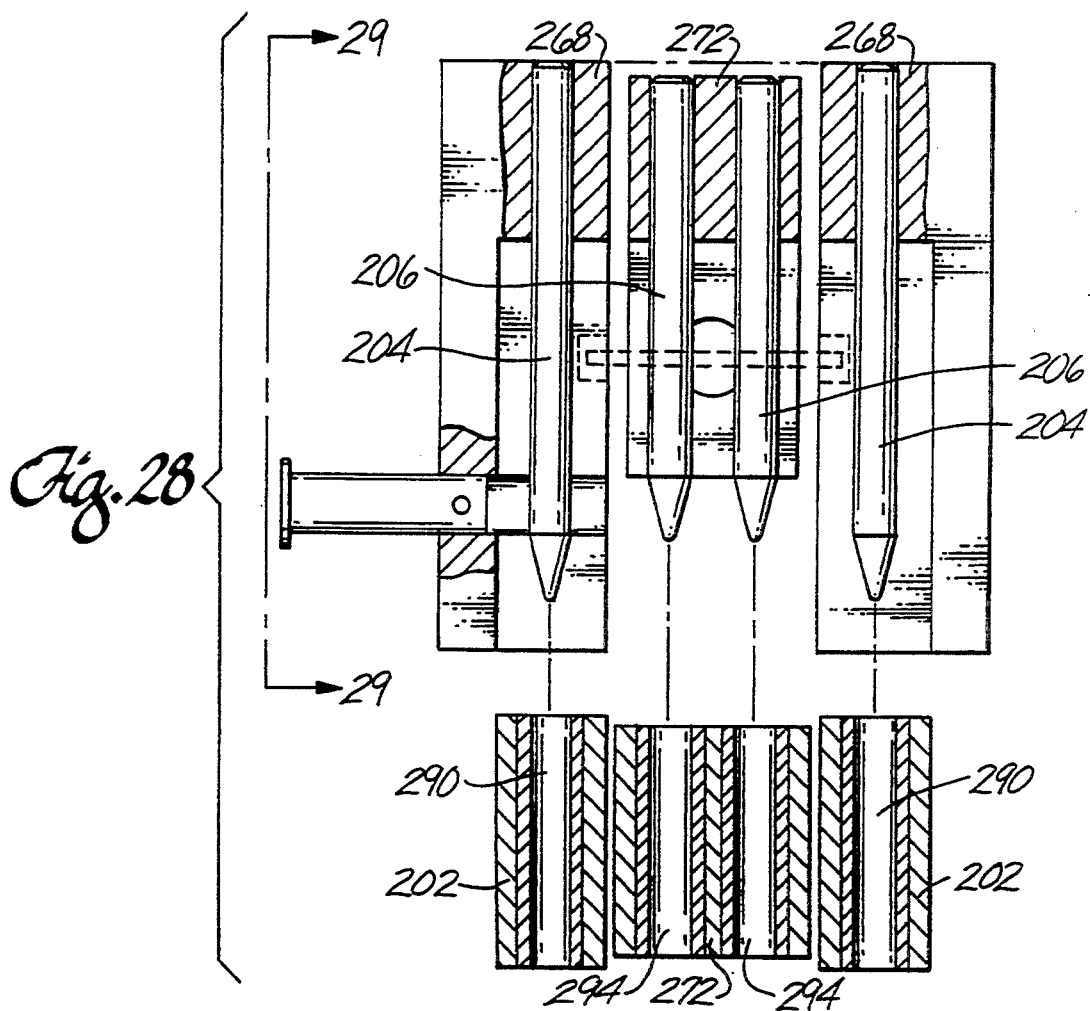
FIG. 28 is a cross-sectional view showing a means for mounting a motor drive unit to a movable top plate of the fixture for use in shifting the top plate during an optical alignment procedure.
Figure 29:
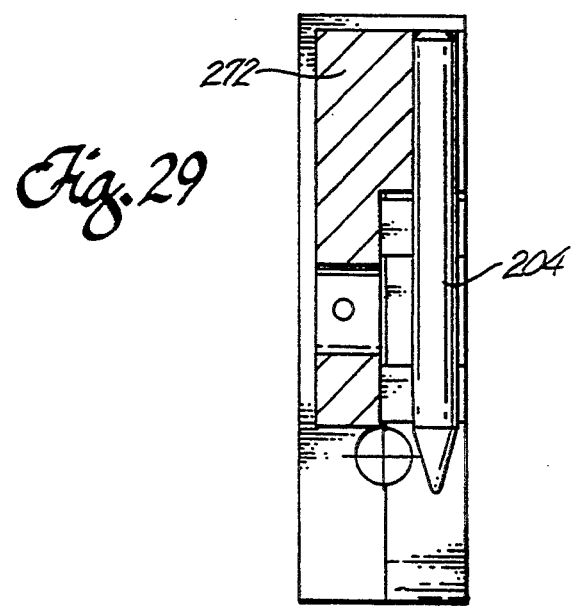
FIG. 29 is a cross-sectional view taken on line 29—29 of FIG. 28.

In using the motor drives, each drive unit is mounted to a corresponding extension arm on the bearing blocks at the front corners of the fixture. FIGS. 28 and 29 illustrate the means for releasably mounting each drive unit to the bearing block. As mentioned previously, the fixed pins 204 of the fixed pin mounting bracket 268 are inserted into corresponding receptacles 290 in a fixed mounting block 202 rigidly affixed to the front of the fixture base. This holds each drive unit in a fixed position relative to the fixture. The drive unit also includes the movable pins 206 carried on the movable pin holder 272 which is driven in the X or Y axis by the drive unit. The pins 206 are inserted into long narrow receptacles 294 in the extension arm 272 of the bearing block at the corner of the fixture. All four pins 204, 206 are inserted into their corresponding receptacles 290, 294, respectively, simultaneously. Thus, when the drive unit is mounted to the front corner of the fixture, the drive unit is held in a fixed position relative to the fixture by the outer pins 204, while the drive units are able to move the top plate in the X, Y or Z directions by the attachment of the pins 206 to the bearing blocks at the front corners of the fixture.

In the alignment process, the drive motors are attached to the front corners of the fixture, the optical alignment system is used to observe any misalignment of the board relative to the probe field, followed by operating the drive motors to shift the top plate until the optical alignment system indicates proper alignment. The drive units then can be removed from the fixture followed by adjustment of the locking pins 110 for holding the linear bearings at the four corners of the fixture in a fixed position relative to the moving top plate. The fixture is then ready for vacuum actuation to test the circuit board.

What is claimed is:

1. A test fixture adapted for automatic alignment of test probes with circuits on a printed circuit board under test, comprising:

a fixture base having a fixed probe plate;

an array of test probes supported in the probe plate, the test probes being individually movable in an axial direction generally perpendicular to the probe plate;

a top plate supported by bearing means in a position generally parallel to the probe plate and adapted for movement toward and away from the probe plate and the array of test probes, the top plate supporting the board under test in a position generally parallel to the top plate so that the test probes can contact circuits on the board under test when the top plate and probe plate are moved toward each other;

a plurality of bearing means supporting the top plate for said movement toward and away from the probe plate for moving the test probes into and out of alignment with the circuits on the board under test, each bearing means including a cooperating post and sleeve connected between the probe plate and the top plate, in which the post slides axially in the sleeve in a direction substantially perpendicular to the probe plate and the top plate to provide guided travel of the top plate relative to the probe plate, the bearing means further including adjustment means having a first position in which the post and sleeve are slidable laterally relative to the probe plate in a direction generally parallel to the probe plate, for allowing the top plate to be freely slidable laterally in a direction generally parallel to the plane of the board under test to align the circuits on the board relative to the test probes, the adjustment means having a second position in which the post and sleeve are retained in fixed positions relative to each other and relative to the probe plate for preventing said slidable lateral movement of the top plate, for guiding the travel of the top plate relative to the probe plate when the circuits on the board are aligned with the test probes; and optical alignment means including a fiber optic image guide affixed to the probe plate for sensing an image of a fixed indexing mark on the board, means for converting the sensed image into a display of the indexing mark, means for generating an image of a fixed reference point representing a correct alignment of the circuits on the board relative to the test probes, and means for moving the images of the sensed indexing mark and the fixed reference point into alignment to automatically indicate correct alignment of the circuits on the board relative to the test probes, the bearing means being retained in said first position to permit said alignment and thereafter adjusted to their second position to provide for said guided travel of the correctly aligned board relative to the array of test probes.

* * * * *